(12) United States Patent
Katsumi

(10) Patent No.: US 6,814,258 B2
(45) Date of Patent: Nov. 9, 2004

(54) ELECTRIC COMPONENT FEEDER

(75) Inventor: Hiroshi Katsumi, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 182 days.

(21) Appl. No.: 10/196,231

(22) Filed: Jul. 17, 2002

(65) Prior Publication Data

US 2003/0057229 A1 Mar. 27, 2003

(30) Foreign Application Priority Data

Jul. 23, 2001 (JP) ........................................ 2001-221467

(51) Int. Cl.$^7$ ................................................ B23Q 7/04
(52) U.S. Cl. .................... 221/211; 221/236; 221/239
(58) Field of Search ............................... 221/211, 236, 221/239; 29/739, 743, 742, 759

(56) References Cited

U.S. PATENT DOCUMENTS

| | | | | |
|---|---|---|---|---|
| 4,567,652 A | * | 2/1986 | Gussman et al. | 29/837 |
| 4,732,254 A | * | 3/1988 | Nishizaki et al. | 29/741 |
| 5,214,841 A | * | 6/1993 | Howard et al. | 29/721 |
| 6,332,558 B1 | | 12/2001 | Udagawa et al. | |

FOREIGN PATENT DOCUMENTS

| | | |
|---|---|---|
| JP | A 8-222890 | 8/1996 |
| JP | A 2000-244186 | 9/2000 |

* cited by examiner

Primary Examiner—David H. Bollinger
(74) Attorney, Agent, or Firm—Oliff & Berridge, PLC

(57) ABSTRACT

An electronic-component feeder including a component conveying device which conveys an electronic component to a component-take aperture where an end surface of the component is engaged with a positioning surface of a stopper member and accordingly the component is positioned in a component-convey direction. Then, a pressing-member driving device is operated to drive a pressing member so that a side surface of an end portion of the pressing member presses a side surface of the component against a positioning surface of a cover member fixed to a main frame of the feeder, thereby positioning the component also in a lateral direction perpendicular to the component-convey direction. Since the electronic component is supplied in the state in which the component is positioned in each of the component-convey direction and the lateral direction, a component holding head can suck and hold the component with increased reliability.

18 Claims, 13 Drawing Sheets

ELECTRIC COMPONENT FEEDER

BACKGROUND OF THE INVENTION

1. Field of the Invention

The present invention relates to an electric-component feeder which supplies, from a component-supply portion thereof, a plurality of electric components (e.g., electronic components).

2. Discussion of Related Art

There is known an electric-component feeder which includes a component conveying device that conveys a plurality of electric components, one by one, to a component-supply portion of the feeder, and which is used in, e.g., an electric-component mounting system. Each electric component supplied to the component-supply portion is taken by a component taking device, and is mounted on a component-mount place on a circuit substrate so as to produce an electric circuit. The conventional component taking device includes a component positioning member that accurately positions each electric component, which is mounted on the circuit substrate. Alternatively, from the electric-component feeder, each electric component is sucked and taken by a suction nozzle and, during a time duration in which the electric component is conveyed by the suction nozzle to the component-mount place on the circuit substrate, an image of the component is taken by an image taking device and the taken image is processed to detect a positional error of the component held by the nozzle. In the latter case, after the suction nozzle and the circuit substrate are positioned at a relative position that has been modified by the detected positional error, the electric component is mounted on the circuit substrate.

However, in the case where a component positioning member is used to position each electric component, it is needed to change the current component positioning member with a different component positioning member corresponding to the size or sort of each electric component. Thus, the component taking device needs to have a complex construction, and additionally it needs a long time to change the component positioning members. This leads to making it difficult to increase the operation efficiency. Meanwhile, in the case where the taken image is processed to detect the positional error of the electric component held by the suction nozzle, it is needed to take the image of each electric component and complete the processing of the taken image during the time duration from the time when the component taking device takes the electric component from the electric-component feeder to the time when the taking device mounts the component on the circuit substrate. Thus, it needs a long time to take and mount each electric component. In addition, if an electric component is inaccurately positioned in the component-supply portion, the component taking device may fail to take the component.

SUMMARY OF THE INVENTION

It is therefore an object of the present invention to solve one of the above-identified problems by accurately positioning an electric component or supplying an electric component in a state in which a positional error of the component is known. This object may be achieved according to any one of the following modes of the present invention in the form of an electric-component feeder, each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without some of the features described with respect to the same mode.

(1) An electric component feeder, comprising:
  a component conveying device which conveys, in a component-convey direction, a plurality of electric components, one by one, to a component-supply portion of the feeder; and
  at least one of (a) a positioning device which is provided in the component-supply portion of the feeder and which positions each of the electric components in each of the component-convey direction and a lateral direction perpendicular to the component-convey direction, and (b) a position detecting device which is provided in the component-supply portion of the feeder and which detects a position of each of the electric components.

In the present electric-component feeder, in the case where the electric component conveyed to the component-supply portion is positioned in each of the component-convey direction and the lateral direction perpendicular to the component-convey direction, a component taking device can take the electric component with reduced possibilities of failing to take, or can take the component being accurately positioned and mount the component at an accurate position on a circuit substrate. Meanwhile, in the case where the position detecting device is employed to detect the position of the electric component, the component taking device can be positioned relative to the electric-component feeder while the positional error is modified, before the taking device takes the component. This leads to reducing the possibilities of failing to take an electric component, or eliminating the need of taking and processing an image of an electric component after the taking of the component and before the mounting of the component and thereby improving the efficiency of mounting of electric components. In the case where both of the above-indicated two elements (a), (b), an appropriate one of the two elements can be selectively used depending upon an aim, or both of them can be used to obtain both of the effect of preventing failure to take and the effect of improving the mounting efficiency or the mounting accuracy.

(2) A feeder according to the mode (1), comprising the positioning device, wherein the positioning device comprises two positioning surfaces which face the component-convey direction and the lateral direction, respectively; and a close-contact causing device which causes a close contact between the each electric component and each of the two positioning surfaces.

Since the electric component is brought into the close contact with each of the two positioning surfaces facing the component-convey direction and the lateral direction perpendicular to the component-convey direction, respectively, the electric component can be accurately positioned.

(3) A feeder according to the mode (2), wherein the close-contact causing device comprises:
  a pressing member which presses an opposite side surface of the each electric component that is opposite to an other side surface thereof facing one of the two positioning surfaces; and
  a pressing-member driving device which drives the pressing member so as to press the opposite side surface of said each electric component and thereby cause the close contact between the other side surface of said each electric component and said one positioning surface.

(4) A feeder according to the mode (2) or (3), wherein the component conveying device comprises:

an endless, conveying belt which has a component-support surface supporting the electric components; and a belt circulating device which circulates the conveying belt, and wherein the close-contact causing device comprises the component conveying device that causes the close contact between the each electric component and one of the positioning surfaces that faces the component-convey direction.

If, after the component conveying device causes the close contact between the each electric component and one of the positioning surfaces that faces the component-convey direction, the electric component is brought into close contact with the other positioning surface facing the lateral direction facing the component-convey direction, the electric component can be easily positioned. Since the close-contact causing device comprises the component conveying device, the present electric-component feeder can enjoy a simple construction.

(5) A feeder according to any of the modes (2) to (4), wherein the close-contact causing device comprises a non-contact driving device which drives, without contact, the each electric component toward at least one of the positioning surfaces.

Since the electric component can be positioned without contact, the component can be effectively prevented from being damaged, and additionally the positioning device can usually enjoy a simple construction. The non-contact driving device may be a pressurized-fluid utilizing device or a magnetic-force utilizing device as described in the mode (6) or the following modes.

(6) A feeder according to the mode (5), wherein the non-contact driving device comprises a pneumatic driving device which pneumatically drives the each electric component toward the one positioning surface.

Preferably, the pneumatic driving device is provided by a device which causes a pressure difference on both sides of an electric component. For example, the pneumatic driving device may be a device which applies a pressurized air to a side surface of the electric component; a device which applies a negative pressure to a side surface of the component; or a device which applies the pressurized air and the negative pressure to opposite side surfaces of the component, respectively.

(7) A feeder according to the mode (6), wherein the pneumatic driving device comprises:

a suction passage which opens in the one positioning surface; and a suction device which sucks air through the suction passage.

(8) A feeder according to any of the modes (2) to (4), wherein the close-contact causing device comprises a magnet which attracts the each electric component toward at least one of the positioning surfaces.

(9) A feeder according to the mode (8), wherein the magnet comprises an electromagnet; and an electric-current control device which controls an electric current supplied to the electromagnet.

When an electric component is attracted, the electromagnet is magnetized and, when the component is taken from the component-supply portion, the electromagnet is demagnetized. Thus, the electric component is effectively positioned and taken.

(10) A feeder according to any of the modes (1) to (9), comprising the position detecting device, wherein the position detecting device comprises an image taking device which takes an image of the each electric component.

The image taking device may be a device which takes an image of an electric component supported on a support surface, from above the component; a device which takes an image of an electric component held by a second conveying device, described later, from below the component; or a device which is described in the following mode.

(11) A feeder according to the mode (10), wherein the position detecting device further comprises a transparent support member which is formed of a transparent material and which supports a bottom of the each electric component, and wherein the image taking device takes, at a position below the transparent support member, an image of the each electric component supported by the transparent support member.

Since the image taking device takes an image of an electric component from below the component, a space above the electric-component feeder can be used to allow an electric-component receiving device or the like to perform its operation.

(12) A feeder according to the mode (11), wherein the transparent support member has a support surface which supports the each electric component, and a suction passage which opens in the support surface so as to apply a negative pressure to the each electric component and thereby attract the each electric component to the support surface.

Since the transparent support member applies a negative pressure to an electric component and thereby attracts the component, the component is effectively prevented from being moved on the transparent support member after the position of the component is detected.

(13) A feeder according to the mode (11) or (12), wherein the component conveying device comprises:

a first conveying device which conveys the electric components in an array; and a second conveying device which takes the each electric component conveyed by the first conveying device and conveys the each electric component onto the transparent support surface.

According to this mode, the position of each electric component can be easily detected.

(14) A feeder according to the mode (13), wherein the second conveying device comprises:

a suction member which has a lower surface and a suction passage opening in the lower surface and which applies a negative pressure to the each electric component and thereby attracts the each electric component to the lower surface; and a moving device which moves the suction member to a receiving position located in a downstream-end portion of the first conveying device and to a transferring position facing the transparent support member.

According to this mode, the second conveying device can enjoy a simple construction.

(15) A feeder according to the mode (14), wherein the moving device comprises:

a pivotable member which is pivotable about a substantially horizontal first axis line and which supports the suction member such that the suction member is pivotable about a second axis line parallel to the first axis line; and a pivoting device which pivots the pivotable member about the first axis line.

Since the suction member can be moved to the receiving position and the transferring position, by a simple motion, i.e., the pivotal movement of the pivotable member, the moving device can enjoy a very simple construction or can be easily controlled.

(16) A feeder according to the mode (15), wherein the moving device further comprises:

a stopper device which engages, at at least opposite ends of a pivotal-movement range in which the pivotable member is pivotable, the suction member to stop respective pivotal movements of the suction member at the opposite ends of the pivotal-movement range; and a biasing device which biases, at at least the opposite ends of the pivotal-movement range, the suction member in respective directions in each of which the suction member engages the stopper device.

Since the stopper device and the biasing device are employed, the suction nozzle is prevented from being unnecessarily pivoted at at least the receiving position and the transferring position, so that the suction member can reliably take or transfer an electric component.

(17) A feeder according to the mode (16), wherein the biasing device biases, in a state in which the pivotable member has been pivoted in a clockwise direction from a middle point of the pivotal-movement range, the suction member relative to the pivotable member in a direction in which the suction member is pivoted in a counterclockwise direction and biases, in a state in which the pivotable member has been pivoted in the counterclockwise direction from the middle point of the pivotal-movement range, the suction member relative to the pivotable member in a direction in which the suction member is pivoted in the clockwise direction.

According to this mode, the suction member can be prevented from being pivoted at each of the receiving position and the transferring position, and is allowed to be pivoted by the pivotal movement of the pivotable member between the receiving position and the transferring position.

(18) A feeder according to the mode (17), wherein the moving device further comprises a pivotable-member support member which supports the pivotable member such that the pivotable member is pivotable about the first axis line, wherein the suction member includes a first retaining portion positioned above the first axis line and the pivotable-member support member includes a second retaining portion, wherein the biasing device comprises a tension coil spring which is retained by, and between, the first and second retaining portions, and wherein the first and second retaining portions are positioned relative to each other such that at at least the opposite ends of the pivotal-movement range of the pivotal member, the suction member is biased, based on a tensile force of the tension coil spring, in respective directions in each of which the suction member engages the stopper device.

According to this mode, the biasing device recited in the mode (17) can enjoy a very simple construction.

(19) A feeder according to any of the modes (15) to (17), wherein the moving device further comprises a pivotable-member support member which supports the pivotable member such that the pivotable member is pivotable about the first axis line.

DETAILED DESCRIPTION OF THE PREFERRED EMBODIMENTS

Figure 1:
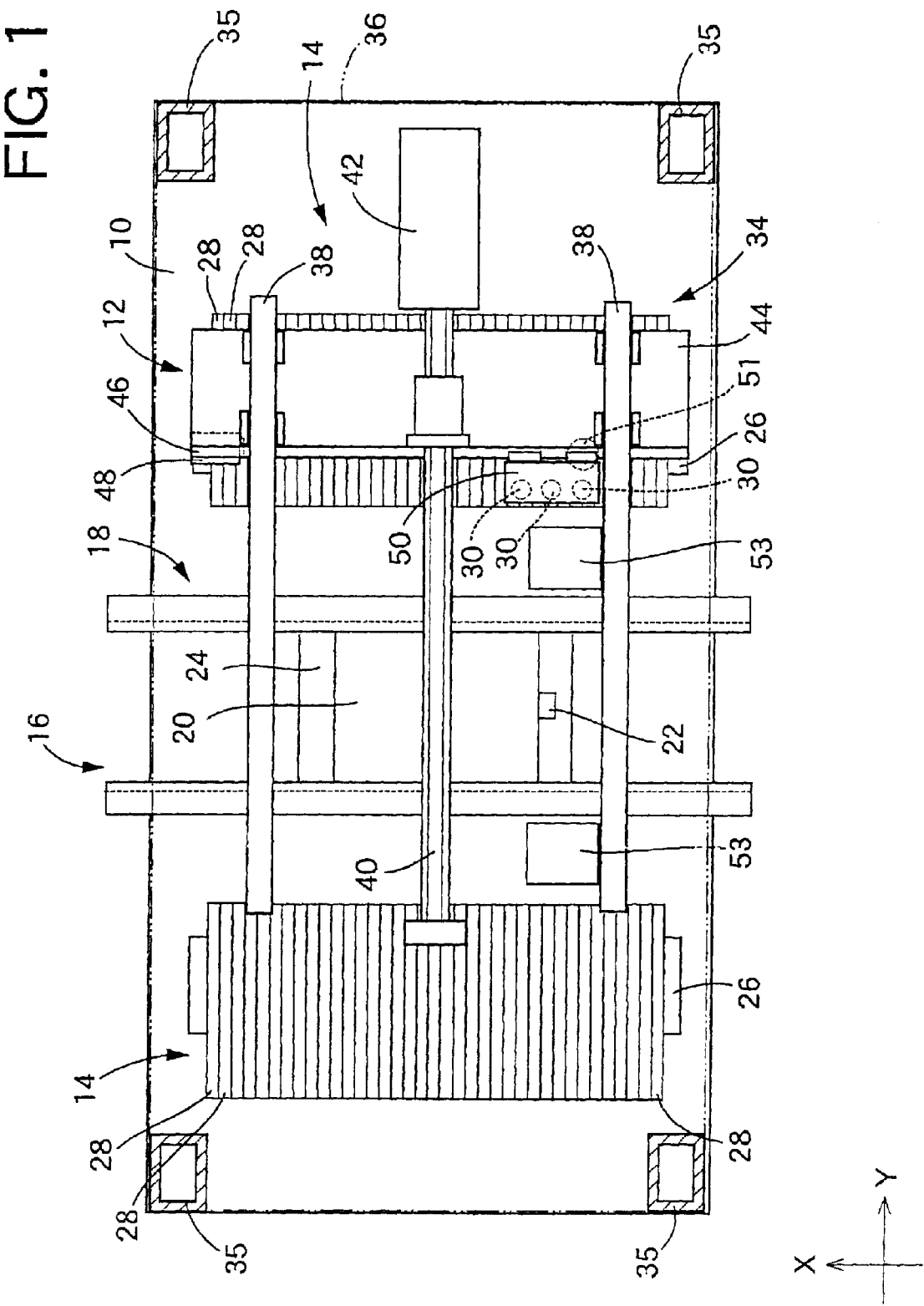
FIG. 1 is a schematic plan view of an electronic-component mounting system including an electronic component feeder as an embodiment of the present invention.

Hereinafter, there will be described in detail, by reference to the drawings, an embodiment of the present invention that is applied to an electronic-component mounting system including an electronic component feeder as an electric component feeder. As shown in FIG. 1, the present electronic-component mounting system includes a base 10, and a mounting device 12, component supplying devices 14, and a printed-wiring-board conveying device 16 that are provided on the base 10. The printed-wiring-board conveying device 16 includes a wiring-board conveyor 18 as a substrate conveyor that extends in an X-axis direction (in FIG. 1) and conveys a printed wiring board 20 as a sort of circuit substrate. The conveying device 16 additionally includes a stopper device 22 that positions the printed wiring board 20 at a component mounting position as a prescribed operation position; and a printed-wiring-board holding device 24 that holds the wiring board 20 being thus positioned.

The two component supplying devices 14 are provided on both sides of the wiring-board conveyor 18 in a Y-axis direction perpendicular to the X-axis direction on a horizontal plane. Each of the component supplying devices 14 is provided at a fixed position, and includes a feeder support table 26, and a number of electronic component feeders 28 (hereinafter, referred to as the "feeders 28"), each as an electric component feeder, that are arranged in the X-axis direction. The mounting device 12 includes component holding heads 30 that are linearly moved in the X-axis and Y-axis directions to receive electronic components 32 (shown in FIG. 3) from the feeders 28, transfer the components 32, and mount the components 32 on the printed wiring board 20 held at the component mounting position. To this end, the mounting device 12 includes an X-Y robot 34 as an X-Y moving device. The X-Y robot 34 is supported by an upper frame 36 that rests on columns 35 provided above the base 10. The upper frame 36 is not shown in FIG. 1 for easier-understanding purposes only, and only a position of the frame 36 is indicated at a two-dot chain line. The X-Y robot 34 includes a Y-axis slide 44 that is guided by a pair of guide members 38 fixed to the upper frame 36 such that the guide members 38 extend horizontally parallel to the Y-axis direction, and is moved by a feed screw 40 and a Y-axis motor (servomotor) 42. The Y-axis slide 44 supports an X-axis slide 50 that is guided by a pair of guide members 46 (only one guide member is shown in FIG. 1), and is moved by a feed screw and an X-axis motor (servomotor) 48. The X-axis slide 50 supports a plurality of component holding heads 30 (three holding heads are shown) such that the holding heads are arranged in the X-axis direction. Each of the component holding heads 30 is moved, by the X-Y robot 34, to an arbitrary position on a horizontal plane.

The X-axis slide 50 supports the component holding heads 30, such that each of the holding heads 30 is vertically movable and is rotatable, and additionally supports respective elevating and lowering devices and respective rotating devices for elevating and lowering the holding heads 30, respectively, and rotating the holding heads 30 about respective axis lines. Moreover, the X-axis slide 50 supports a CCD camera 51 as a mark-image taking device that takes respective images of a plurality of fiducial marks provided on the printed wiring board 20. Each of the component holding heads 30 includes a suction nozzle (shown in FIG. 2) that applies a negative pressure to an electronic component 32 and thereby holds the same; and a holder member (not shown) that holds the suction nozzle 52 such that the nozzle 52 is attachable to, and detachable from, the holder member.

Two CCD cameras 53 each as an image taking device are provided such that each of the two cameras 53 is located at a position between a corresponding one of the two component supplying devices 14 and the printed-wiring-board conveying device 16 in the Y-axis direction, on a path along which each electronic component is transferred from the one supplying device 14 to the printed wiring board 20 held by the conveying device 16. Thus, in the present embodiment, the two CCD cameras as the image taking devices are provided on both sides of the wiring-board conveyor 18 in the Y-axis direction. Each of the CCD cameras 53 takes, from a position below an electronic component 32 held by an appropriate component holding head 30, an image of the component 32. An illuminating device, not shown, is provided for each CCD camera 53 and, when the each CCD camera 53 takes an image, illuminates an object and a vicinity thereof. Each CCD camera 53 may be replaced with a line-scan camera.

Figure 2:
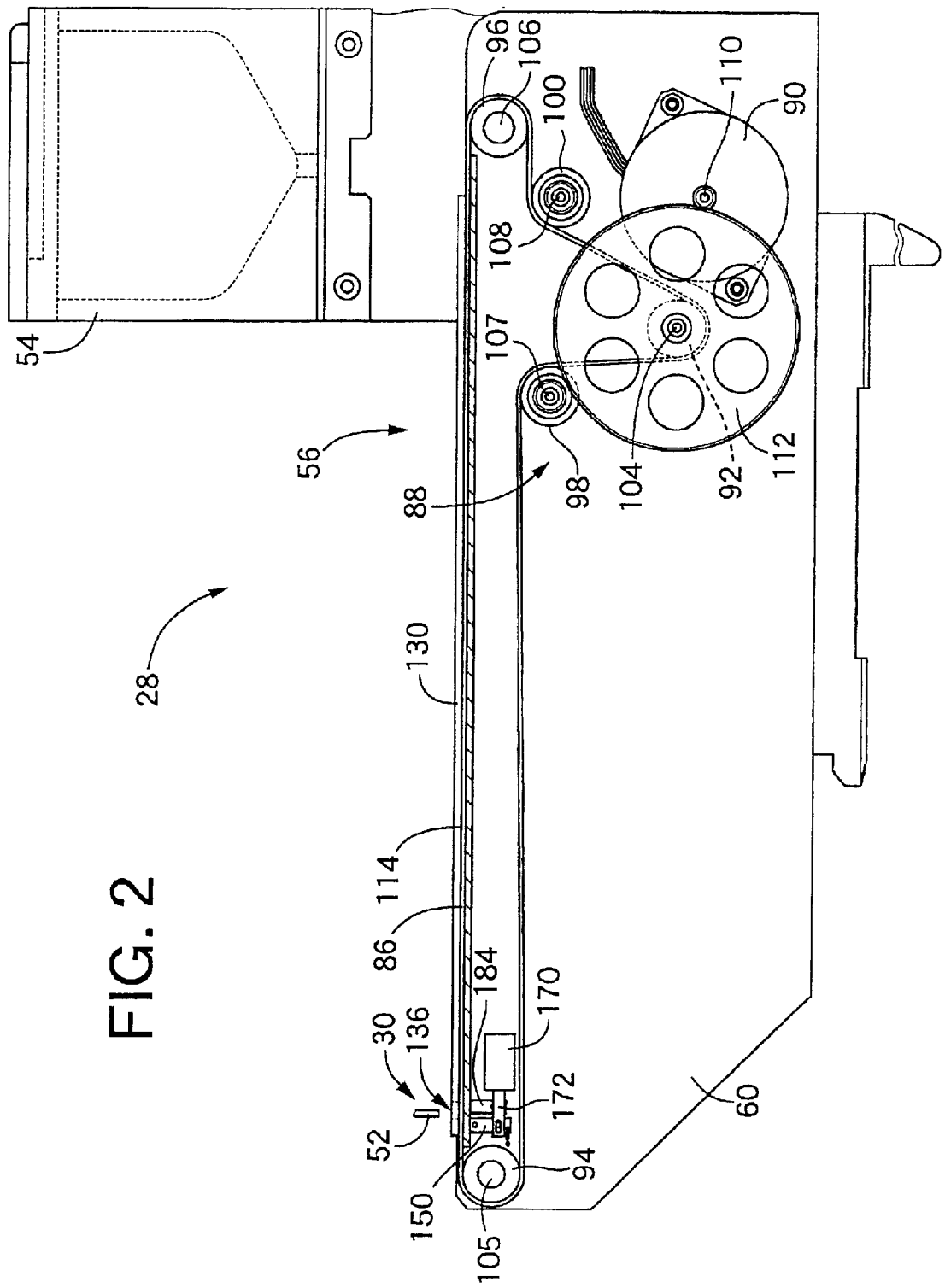
FIG. 2 is a front elevation view of the electronic component feeder.

As shown in FIG. 2, each electronic component feeder 28 includes a case 54 in which a number of electronic components are stored in bulk; and a component conveying device 56 that conveys the electronic components 32, one by one, from the case 54 to the component-supply portion. Thus, in the present embodiment, the electronic-component feeders 28 are so-called "bulk" feeders. Those bulk feeders are disclosed in Japanese Patent Document No. 2000-244186, and accordingly detailed description and illustration of the construction of each bulk feeder is omitted here.

Each electronic component feeder 28 includes a main frame 60 that is easily produced by assembling a plurality of members and functions as an integral assembled member. The main frame 60 has a generally elongate plate-like configuration whose lengthwise direction is a component-convey direction parallel to the Y-axis direction, and whose widthwise direction is perpendicular to the component-convey direction on a horizontal plane and is parallel to the X-axis direction. As described above, the electronic component feeders 28 are set on the feeder support table 26 such that the respective main frames 60 of the feeders 28 assume respective upright postures and respective component-take portions of the respective main frames 60 are arranged along a straight line parallel to the X-axis direction. Each main frame 60 is positioned, by a positioning device including a positioning projection, relative to the feeder support table 26 in the lengthwise and widthwise directions, and is attached, by an engaging device, not shown, to the support table 26 such that the each main frame 60 does not move up off the table 26. Each electronic component feeder 28 can be detached from the feeder support table 26 by releasing the engagement of the engaging device.

As shown in FIG. 2, the component conveying device 56 includes an endless conveyor belt 86 and a belt circulating device 88 that circulates the endless conveyor belt 86 and thereby convey the electronic components 32. The belt circulating device 88 includes a stepper motor 90 as an electric motor that can be rotated in opposite directions and can be controlled with respect to rotation angle; and a drive pulley 92, driven pulleys 94, 96, and a pair of guide pulleys 98, 100 on which the conveyor belt 86 is wound. Thus, in the present embodiment, the conveyor belt 86 is a timing belt, though detailed illustration thereof is omitted; and the drive pulley 92 and the driven pulleys 94, 96 are timing pulleys. The stepper motor 90 is fixed to a side surface of the main frame 60, and the drive pulley 92, the driven pulleys 94, 96, and the guide pulleys 98, 100 are attached via respective support pins 104, 105, 106, 107, 108 to the main frame 60 such that those pulleys are rotatable, relative to the frame 60, about respective axis lines parallel to the widthwise direction of the frame 60. The stepper motor 90 has a rotary output shaft 110 with a pinion that is meshed with a gear 112 that is fixed to one end of the drive pulley 92. Thus, the speed of rotation of the output shaft 110 is reduced, and the thus speed-reduced rotation is transmitted to the drive pulley 92 to drive the conveyor belt 86. The two driven pulleys 94, 96 are provided in a front portion and a rear portion of the main frame 60 in the lengthwise direction. In the present embodiment, the conveyor belt 86 is an endless annular shape, and an upper straight portion of an outer circumferential surface of the belt 86 that linearly extends provides a component support surface 114 that conveys the electronic components 32. Respective side surfaces of the upper straight portion of the conveyor belt 86 are guided by respective side surfaces of a guide groove 118 formed in the main frame 60 in the lengthwise direction. An inner surface of the straight portion of the conveyor belt 86 that is opposite to the component support surface 114 is supported on a bottom surface 124 (FIG. 3) of the guide groove 118.

Figure 3:
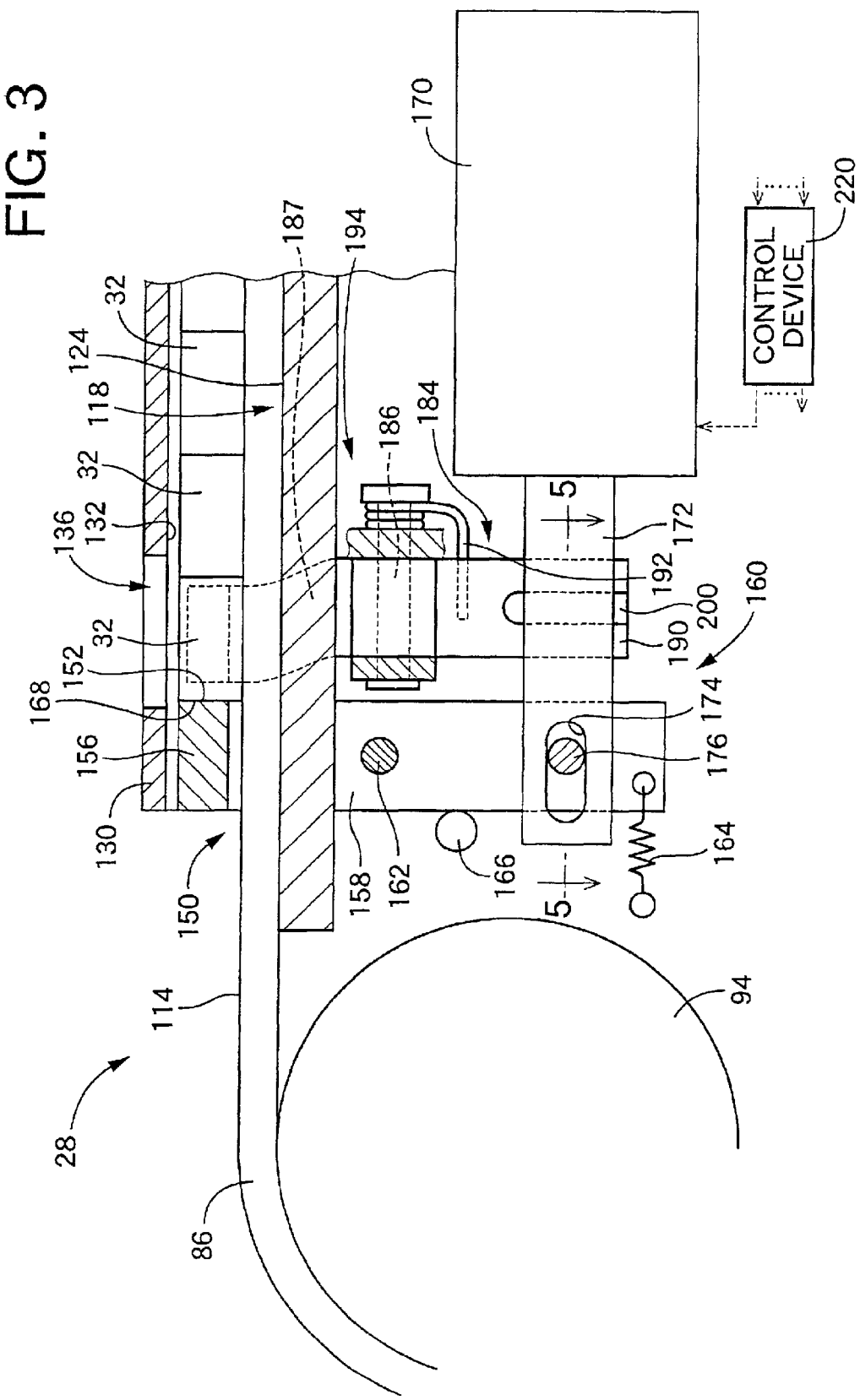
FIG. 3 is a partly cross-sectioned, front elevation view of a positioning device of the electronic component feeder.

As shown in FIG. 3, an upper opening of the guide groove 118 is covered with a cover member 130. The cover member 130 functions as a fixed cover that is fixed to an upper surface of the main frame 60 in a state in which the cover is positioned in the lengthwise direction and the widthwise direction. A lower surface of the cover member 130 that faces the component support surface 114 of the conveyor belt 86, has a guide groove 132 that has a rectangular cross section, has a width smaller than that of the guide groove 118, opens in the lower surface, and is formed through the entirety of the cover member 130 in a direction parallel to the component-convey direction. The guide groove 132 is located at the middle of the guide groove 118 in the widthwise direction. The electronic components 32 arranged on the component support surface 114 are conveyed such that two side surfaces of each of the components that are parallel to the component-convey direction are guided by two side surfaces 133, 134 (FIG. 4) of the guide groove 132, respectively. An upper wall of a component-convey-direction downstream end portion of the cover member 130 that corresponds to the component-supply portion has an opening functioning as a component-take aperture 136 through which the suction nozzle 52 of each component holding head 30, being positioned above the aperture 136, takes an electronic component 32. One of two side walls of a portion of the cover member 130 that corresponds to the component-take aperture 136 (in the present embodiment, the one side wall corresponds to the side surface 133 of the guide groove 132) has an opening as shown in FIG. 4.

Figure 5:
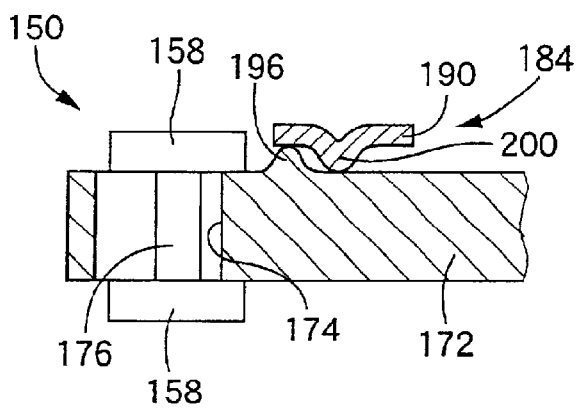
FIG. 5 is a cross-sectioned view taken along 5—5 in FIG. 3.

A stopper member 150 is provided on a downstream side of the cover member 130 in the component-convey direction. The stopper member 150 includes a plate-like rectangular stopper portion 156 having a positioning surface 152 facing the component-convey direction and extending substantially perpendicularly to the component support surface 114; and two attached portions 158 extending downward from two side portions of the stopper portion 156. The attached portions 158 of the stopper member 150 are attached to the main frame 60 via a support pin 162 such that the stopper member 150 is pivotable about an axis line parallel to the widthwise direction of the frame 60. Thus, the axis line of rotation of the stopper member 150 is parallel to that of the driven pulley 94. A stopper-member driving device 160 is operated to rotate the stopper member 150 about the axis line of the support pin 162, so that the positioning surface 152 is moved to an operative position where the positioning surface 152 positions the electronic component 32 in the component-convey direction and to a retracted position where the positioning surface 152 is retracted from the operative position to a downstream side of the operative position in the component-convey direction. In the present embodiment, a tension coil spring 164 as a sort of biasing device is provided between the main frame 60 and a free end portion of one of the attached portions 158 of the stopper member 150, and produces a biasing force to bias the stopper member 150 toward its operative position. When the attached portions 158 are engaged with a stopper 166 fixed to the main frame 60, the stopper member 150 is positioned at its operative position. Thus, the position of the electronic component 32 in the component-convey direction is defined by the engagement of the positioning surface 152 with an end surface 168 of the component 32 that faces the positioning surface 152. The biasing force of the tension coil spring 164 is pre-set at a magnitude that assures that the stopper member 150 is not retracted when the electronic component 32 being conveyed engages the positioning surface 152. The stopper-member driving device 160 includes a solenoid 170 as a drive source, and moves the stopper member 150 toward its retracted position against the biasing force of the tension coil spring 164. The solenoid 170 is connected to a drive member 172 extending in the component-convey direction. The drive member 172 is normally biased by a spring, not shown, in an extension direction parallel to the component-convey direction and, when the solenoid 170 is supplied with an energizing current, the drive member 172 is retracted into the solenoid 170. As shown in FIGS. 3 and 5, the drive member 172 has, in a free end portion thereof, an engaging hole 174 that is elongate in the component-convey direction. The engaging hole 174 is engaged with an engaging pin 176 that fixedly connects between the two attached portions 158 at a position below the support pin 162, such that the engaging hole 174 is movable relative to the engaging pin 176 in a lengthwise direction of the hole 174 and is substantially immovable relative to the pin 176 in a widthwise direction perpendicular to the lengthwise direction. When the solenoid 170 is operated, the drive member 172 is retracted so that the engaging pin 176 is engaged with one end of the engaging hole 174 that is near to the free end of the drive member 172 and, when the drive member 172 is further retracted, the stopper member 150 is pivoted about the support pin 162 in a counterclockwise direction in FIG. 3, against the biasing force of the tension coil spring 164, and thus is retracted to its retracted position.

Figure 4:
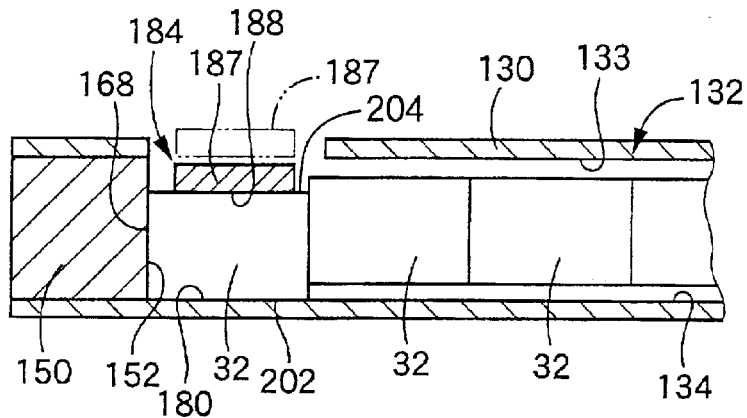
FIG. 4 is a cross-sectioned plan view of a component-supply portion of the electronic component feeder.

As shown in FIG. 4, the side surface 134 of a portion of the cover member 130 that corresponds to the component-take aperture 136, provides a positioning surface 180 facing a lateral direction (the widthwise direction) perpendicular to the component-convey direction. As shown in FIGS. 3 and 4, a pressing member 184 is provided in the opening of the side surface 133 of the cover member 130. The pressing member 184 is supported by the main frame 60 via a support pin 186 such that the pressing member 184 is pivotable about an axis line parallel to the component-convey direction. The pressing member 184 functions as a pivotable lever, and includes one end portion 187 extending upward, so that a side surface (a pressing surface) 188 of the end portion 187 faces the positioning surface 180, and additionally includes an other portion 190 extending downward. The pressing member 184 is biased by a spring 192 in a direction in which the side surface 188 of the pressing member 184 is moved away from the positioning surface 180 and the other end portion 190 engages the drive member 172. The pressing member 184 engages a side surface 204 of the electronic component 32 that is opposite to a side surface 202 thereof facing the positioning surface 180, thereby pressing the component 32 against the positioning surface 180. The pressing member 184 is driven by a pressing-member driving device 194 including a drive source and a motion converting device. In the present embodiment, the pressing-member driving device 194 includes, as its drive source, the solenoid 170 and the drive member 172. Thus, the pressing-member driving device 194 and the stopper-member driving device 160 share the drive source. The drive member 172 has, as an integral portion of a base portion thereof adjacent to its free end portion having the engaging hole 174, a semi-spherical engaging projection 196 (FIG. 5) that projects toward the pressing member 184. Meanwhile, the other end portion 190 of the pressing-member 184 has, as an integral portion of a free-end portion thereof facing the drive member 172, an engaging projection 200 extending in a lengthwise direction of the end portion 190. The other end portion 190 of the pressing member 184 has some elasticity. When the solenoid 170 is operated and the drive member 172 is retracted, the engaging projection 196 of the drive member 172 climbs over the engaging projection 200 of the pressing member 184, the pressing member 184 is pivoted about the axis line of the support pin 186 against the biasing force of the spring 192, so that the side surface 188 of the pressing member 184 engages the side surface 204 of the electronic component being positioned in the component-supply portion, thereby pressing the side surface 202 of the component 32 opposite to the side surface 204 thereof against the positioning surface 180 and thereby positioning the component 32 in the lateral direction. The engaging projection 196 of the drive member 172 functions as a drive cam; the engaging projection 200 of the pressing member 184 functions as a driven cam; and the drive and driven cams cooperate with each other to provide an example of the motion converting device that converts a linear movement of the drive member 172 in a direction parallel to the component-convey direction into a rotation of the pressing member 184 about an axis line parallel to the component-convey direction.

The present electronic-component mounting system is operated under control of a control device 220 (FIG. 3). The control device 220 is essentially provided by a computer, and controls respective operations of the Y-axis motor 42, the X-axis motor 48, the stepper motors 90, the solenoids 170, the respective elevating and lowering devices and respective rotating devices of the component holding heads 30, etc.

Next, there will be described an operation of the present system. When electronic components 32 are mounted on a printed wiring board 20, the X-Y robot 34 moves one of the component holding heads 30 that is to next suck and hold an electronic component 32, to a component taking position (a component sucking position).

In a state in which each feeder 28 is waiting for taking of electronic components 32 therefrom, the leading one of the electronic components 32 has been fed to a component-take portion and positioned in the component-take aperture 136, and has been brought into close contact with the positioning surface 152 of the stopper member 150. Then, the component holding head 30 is lowered. Before the head 30 takes the electronic component through the component-take aperture 136, the solenoid 170 is operated and the drive member 172 is retracted, concurrently with the lowering of the head 30, so that the engaging projection 196 of the drive member 172 climbs over the engaging projection 200 of the pressing member 184. Consequently the pressing member 184 is pivoted, and the side surface 188 engages the side surface 202 of the electronic component 32 positioned in the component-take aperture 136, thereby pressing the side surface 202 of the component 32 against the positioning surface 180. Thus, the electronic component 32 is brought into close contact with the two positioning surfaces 152, 180 and accordingly is positioned with respect to each of the component-convey direction and the lateral direction. In this state, the component 32 is positioned in the component-take aperture 136. The drive member 172 is further retracted, and the component holding head 30 is further lowered. Immediately before the head 30 sucks an upper surface of the component 32 as a to-be-sucked surface thereof, the side surface 188 of the pressing member 184 is brought into a state in which the side surface 188 is separate from the side surface 204 of the component 32, and the drive member 172 is retracted from a state in which the engaging pin 176 of the stopper member 150 is engaged with the end of the engaging hole 174 that is near to the free end portion of the drive member 172, so that the stopper member 150 is pivoted about the axis line of the support pin 162 toward its retracted position and the positioning surface 152 of the stopper portion 156 is separated from the component 32. Thus, after the electronic component 32 is positioned in each of the component-convey direction and the lateral direction, the component 32 is released from the pressed contact with the two positioning surfaces 152, 180. Thus, the component holding head 30 is allowed to easily take the component 32 from the component-take aperture 136.

Subsequently, one of the component holding heads 30 that is to next take an electronic component 32 is moved to a position right above a component-take position of a desired electronic-component feeder 28, and takes the component 32 that has been positioned in the same manner as described above. Thus, the plurality of component holding heads 30 sequentially suck and hold the electronic components 32, conveys the components 32 to respective component-mount places on the printed wiring board 20 being positioned and held at the component mounting position, and sequentially mount the components 32 on the board 20.

In the present embodiment, the pressing member 184 and the pressing-member driving device 194 cooperate with the component conveying device 56 to provide a close-contact causing device. Thus, in the present embodiment, the component conveying device 56 functions as part of the close-contact causing device. In addition, the two positioning surfaces 152, 180 and the close-contact causing device cooperate with each other to provide a positioning device.

In the present embodiment, before the component holding head 30 sucks the electronic component 32, the electronic-component feeder 28 positions the component 32 in each of the component-convey direction and the lateral direction. Therefore, the head 30 can easily and reliably suck and hold the center of the component 32, which leads to lowering the possibilities of failing to suck the component 32 and improving the efficiency of mounting of electronic components.

In a particular case where the plurality of (three) component holding heads 30 can be controlled such that the holding heads 30 are concurrently elevated or lowered and the electronic-component feeders 28 are arranged at a pitch corresponding to a pitch at which the holding heads 30 are arranged, the holding heads 30 can concurrently suck respective electronic components 32 that have been supplied and positioned by the feeders 28 in the same manner as described above.

In the above-described embodiment, the close-contact causing device causes the pressing member 184 to contact the electronic component 32 and thereby cause the close contact between the component 32 and the positioning surface 180. However, it is possible to employ a non-contact driving device that drives, without contact, an electronic component 32 toward the positioning surface 180. Hereinafter, there will be described some embodiments of the non-contact driving device. The illustration and description of the same elements of those embodiments as those of the embodiment shown in FIGS. 1 to 5 are omitted, and only different elements of those embodiments are illustrated and described.

Figure 6:
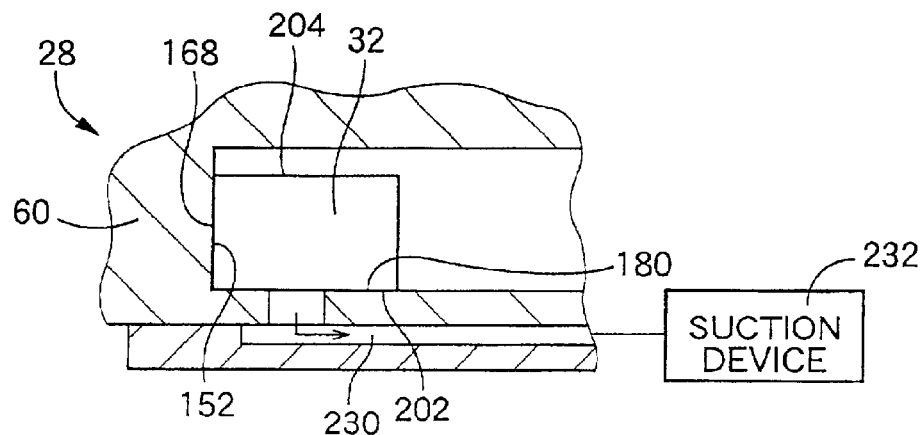
FIG. 6 is a cross-sectioned plan view of a component-supply portion of another electronic component feeder as another embodiment of the present invention.

The non-contact driving device may be a pneumatic driving device which drives an electronic component 32 by utilizing a pressurized air. For example, as shown in FIG. 6, a main frame 60 (or a cover member 130) of an electronic-component feeder 28 is provided with a suction passage 230 that opens in a positioning surface 180 facing a lateral direction perpendicular to a component-convey direction and is connected to a suction device 232. When the suction device 232 is operated in a state in which the electronic component 32 has been conveyed by a component conveying device 56 and positioned in the component-convey direction, air present in a component-take aperture 136 is sucked through the suction passage 230, so that a side surface 202 of the electronic component 32 that faces the positioning surface 180 is brought into close contact with the positioning surface 180. Thus, the electronic component 32 can be positioned, without contact, in the lateral direction. In this way, the electronic component 32 can be effectively positioned while being prevented from being damaged. The suction device 232 (or a control valve thereof) is operated by the control device 220 such that immediately before a component holding head 30 sucks and holds a to-be-sucked surface of the electronic component 32, the communication between the suction passage 230 and the suction device 232 is shut off and consequently the suction of air from the component-take aperture 136 is stopped. Thus, the component holding head 30 can take the electronic component 32 being positioned in the two directions. The pneumatic driving device may be of a different sort in which a pressurized air is applied to a side surface 204 of the electronic component 32 so that the side surface 202 of the component 32 is brought into close contact with the positioning surface 180.

Figure 7:
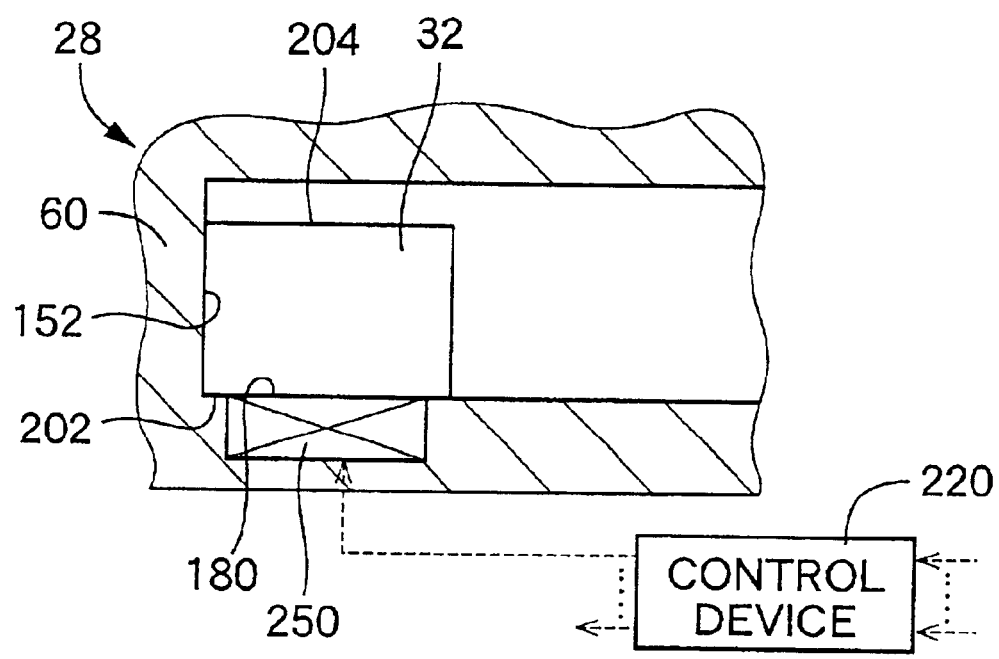
FIG. 7 is a cross-sectioned plan view of a component-supply portion of another electronic component feeder as another embodiment of the present invention.

Next, there will be described another embodiment of the non-contact driving device. In the present embodiment, the non-contact driving device includes a magnet that applies a magnetic force to an electronic component 32 and thereby attracts the component 32 toward a positioning surface 180. In FIG. 7, the magnet is provided in the form of an electromagnet 250. The electromagnet 250 is provided in a side wall of a main frame 60 or a side wall of a cover member 130, and a surface of the electromagnet 250 is used as part of the positioning surface 180. A control device 220 functions as an electric-current supplying device that supplies an electric current to the electromagnet 250. After the electronic component 32 has been conveyed by a component conveying device and stopped by a positioning surface 152, and before a component holding head 30 sucks and holds the component 32, the control device 220 magnetizes the electromagnet 250 so as to attract the component 32 toward the positioning surface 180 and thereby position the component 32 in the lateral direction as well. Then, before the component holding head 30 sucks and holds the electronic component 32, the control device 220 demagnetizes, or reduces the magnetic force of, the electromagnet 250 so as to allow the head 30 to take the component.

In each of the above-described embodiments, it is possible to convey each electronic component 32 by utilizing an air pressure. For example, it is possible to employ a negative air pressure to suck the component 32, or employ a positive air pressure to feed the component 32, in the component-convey direction.

Figure 8:
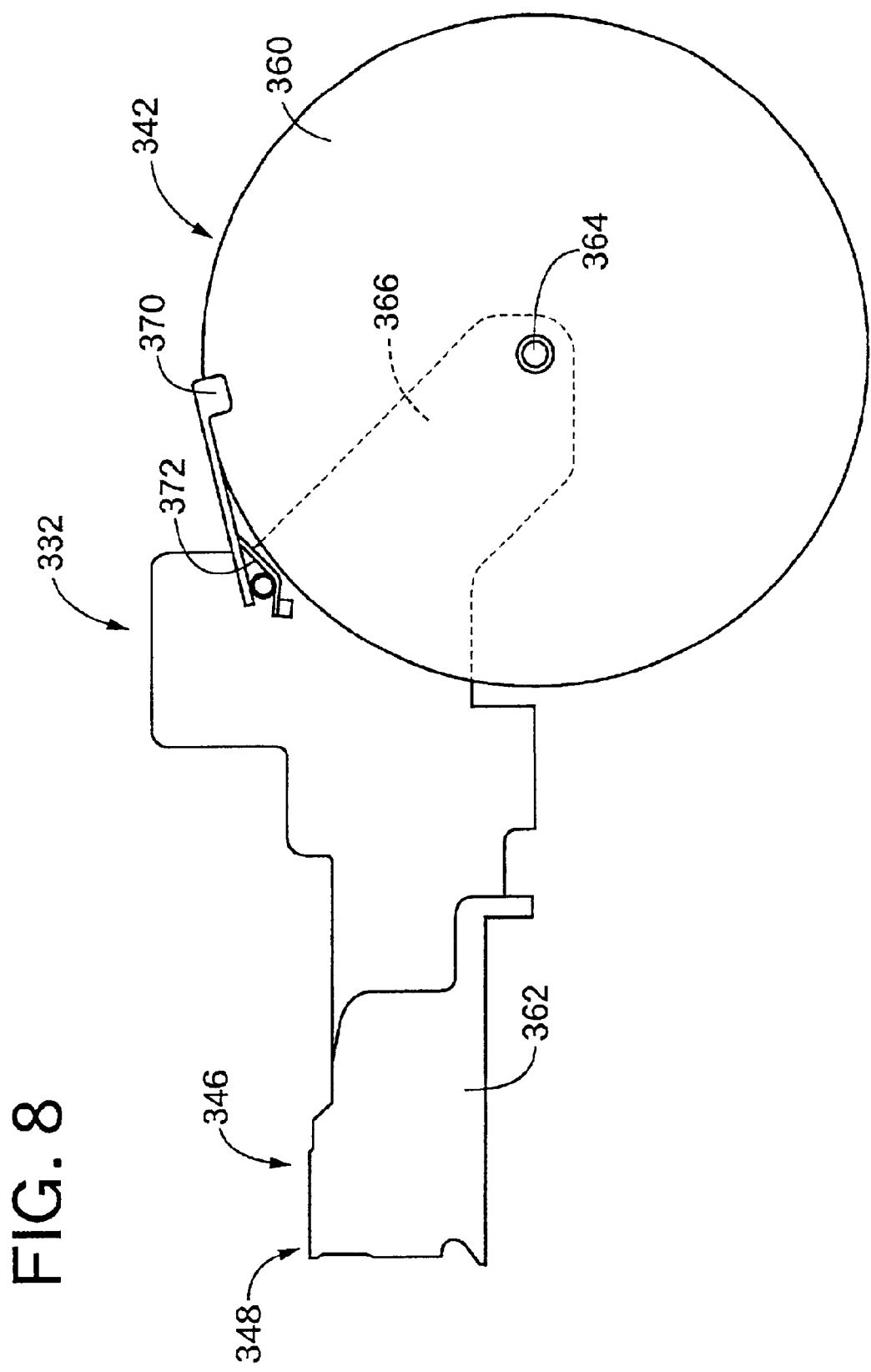
FIG. 8 is a schematic front elevation view of another electronic component feeder as another embodiment of the present invention.

There will be described another embodiment of the present invention that relates to an electronic-component mounting system including an electronic-component feeder, by reference to FIGS. 8 to 15. A general construction of the present electronic-component mounting system may be identical with that of the mounting system shown in FIGS. 1 to 5, and accordingly the same reference numerals as used in the latter system are used to designate the corresponding elements of the former system and the illustration and description thereof is omitted. As schematically shown in FIG. 8, an electronic-component feeder 332 includes a tape-storing device 342, a component conveying device 346, and an image taking device 348. The component conveying device 346 includes a first conveying device and a second conveying device. The first conveying device conveys electronic components 350 in an array toward a component receiving position corresponding to a downstream end of the device in the component-convey direction, and the second conveying device conveys an electronic component 350 that has been conveyed to the component receiving position, to a component transferring position where the component 350 faces the image taking device 348. The component transferring position is also a component taking position where a component holding head 30 takes the component 350. At the component taking position, the component holding head 30 sucks and holds the component 350, and takes the same 350 from the feeder 332. The component conveying device 346 and the image taking device 348 will be described later.

Figure 9:
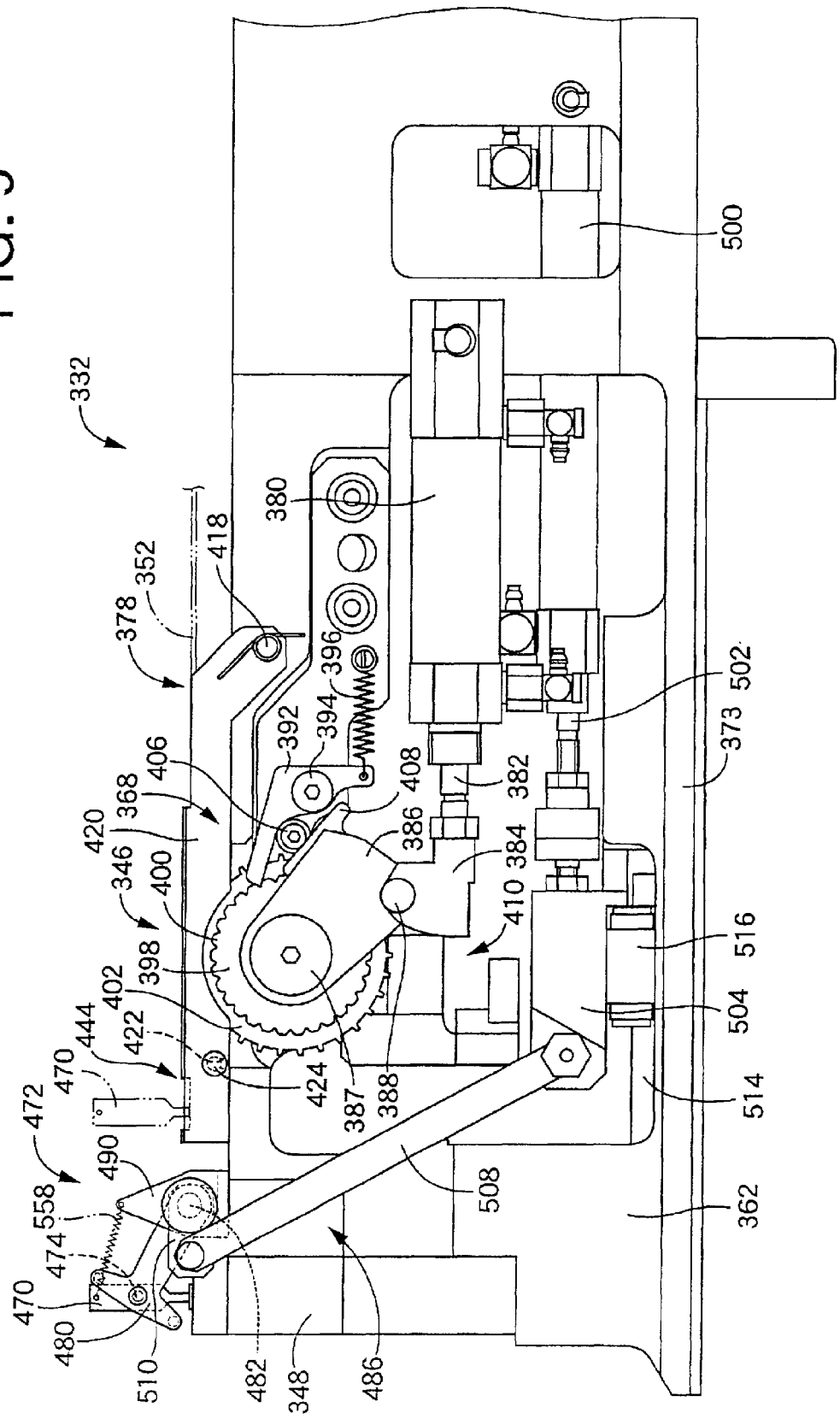
FIG. 9 is a front elevation view of a portion of the electronic component feeder.
Figure 10:
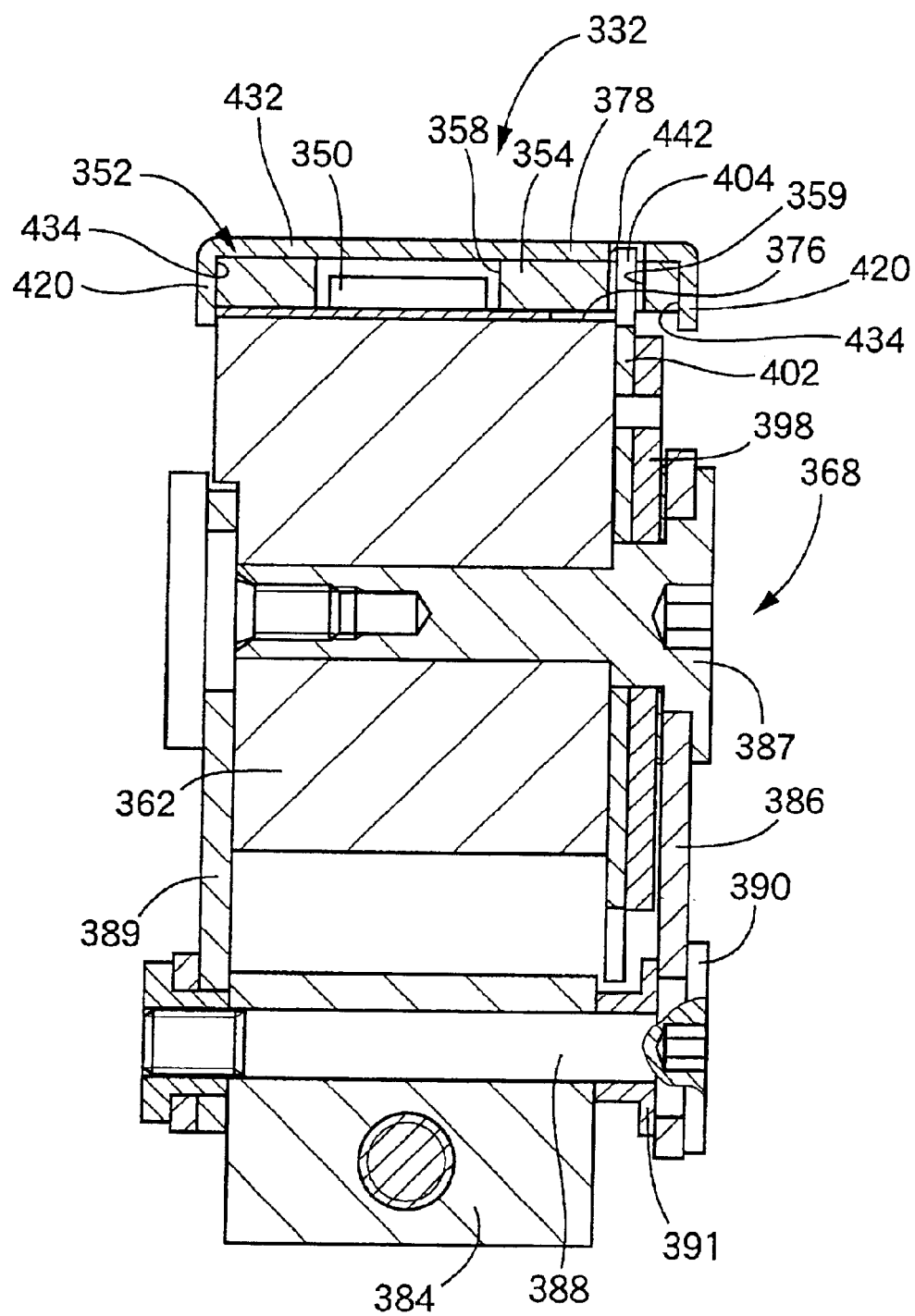
FIG. 10 is a cross-sectioned side elevation view of the electronic component feeder.

The electronic components 350 supplied by the electronic-component feeder 332 are provided in the form of a component carrier tape 352 (FIGS. 9 and 10). As shown in FIG. 10, the component carrier tape 352 includes a base tape 354 and a cover film (not shown) that cooperate with each other to carry the electronic components 350. The base tape 354 has a number of component accommodating pockets 358 that open upward and are formed at a regular pitch in a lengthwise direction thereof. Each of the pockets 358 accommodates an electronic component 350. The cover film is adhered to an upper surface of the base tape 354 to close the respective openings of the component accommodating pockets 358. The base tape 354 has perforations 359 formed through a thickness thereof at a regular pitch in a lengthwise direction thereof.

As shown in FIG. 8, the component carrier tape 352 is wound around a reel 360, and the reel 360 is detachably attached to a support portion 366 that is provided in a rear portion of a main frame 362 of the feeder and includes a support pin 364. The support pin 364 and the support portion 366 cooperate with each other to provide the tape storing device 342. The support portion 366 is provided with a reel hold-down member 370, such that the reel hold-down member 370 is pivotable about an axis member and is biased by a spring 372 in a direction in which the hold-down member 370 engages an outer circumferential surface of the reel 360, thereby resisting the rotation of the reel 360. The component carrier tape 352 wound around the reel 360 and stored by the tape storing device 342 is fed by a tape feeding device 368 that provides the first conveying device.

As shown in FIG. 9, the main frame 362 has a generally elongate, plate-like member, and is set on a feeder support table 330 such that the main frame 362 takes an upright position and a lengthwise direction and a thicknesswise (widthwise) direction of the main frame 362 are horizontal. The main frame 362 has, in a lower end portion thereof, a fitting portion 373 including a positioning projection. In a state in which the positioning projection of the fitting portion 373 fits in a positioning groove (not shown) of the feeder support table 330 and accordingly the main frame 362 is positioned in the widthwise and lengthwise directions, the feeder 332 is set on the table 330.

As shown in FIG. 10, an end portion of the component carrier tape 352 that has been drawn from the reel 360, is placed on an upper surface 376 of the main frame 362, is covered with a cover 378, and is fed by the tape feeding device 368 while being guided by, and between, the upper surface 376 of the main frame 362 and the cover 378.

The tape feeding device 368 feeds, in the Y-axis direction perpendicular to the X-axis direction and parallel to the lengthwise direction of the main frame 362, the component carrier tape 352 at the same feeding pitch as the prescribed forming pitch at which the component accommodating pockets 358 are formed in the tape 352, i.e., a distance between respective centers of each pair of adjacent pockets 358. As shown in FIG. 9, the tape feeding device 368 includes an air-cylinder device 380. The air-cylinder device 380 is of a double-action type in which two air chambers are selectively communicated with a pressurized-air supply source and an atmosphere, respectively, so that a piston rod 382 is extended and retracted. A stopper block 384 is fixed to a free end of the piston rod 382, and a pivotable plate 386 is connected to the stopper block 384 such that the plate 386 is pivotable relative to the block 384. As shown in FIG. 10, an intermediate portion of the pivotable plate 386 is connected to an end portion of a support pin 387 fixed to the main frame 362, such that the plate 386 is pivotable about a horizontal axis line perpendicular to a tape-feed direction (a component-convey direction), and a lower end portion of the plate 386 fits on a connecting pin 388 fixed to the stopper block 384, such that the plate 386 is pivotable about the pin 388. When the piston rod 382 is extended or retracted, the pivotable plate 386 is pivoted in a forward direction or a backward direction. Opposite end portions of the connecting pin 388 project from the stopper block 384, such that one of the projecting end portion fits in the pivotable plate 386. The other projecting end portion of the pin 388 fits in a link 389 pivotally attached to the other end portion of the support pin 387, such that the other projecting end portion is pivotable relative to link 389. Since a head portion 390 of the connecting pin 388 and a flange of a sleeve 391 cooperate with each other to accurately sandwich the pivotable plate 386, the connecting pin 388 and the stopper block 384 are allowed to be pivoted relative to the pivotable plate 386, while the pin 388 is prevented from being tilted. The link 389 cooperates with the head portion and the flange to prevent the tilting of the pin 388.

As shown in FIG. 9, the pivotable plate 386 supports a ratchet pawl 408 via a support pin, not shown, such that the ratchet pawl 408 is pivotable relative to the plate 386. The ratchet pawl 408 is biased by a spring, not shown, as a biasing device in a direction in which the pawl 408 engages teeth 400 of a ratchet wheel 398. The ratchet wheel 398 is attached to a sprocket 402 rotatably supported by the support pin 387, such that the wheel 398 is not rotatable relative to the sprocket 402. As shown in FIG. 10, teeth 404 of the sprocket 402 are engaged with the perforations 359 of the base tape 354 and, when the piston rod 382 is retracted and the pivotable plate 386 is pivoted in the forward direction, the ratchet pawl 408 is moved while keeping the state in which the pawl 408 is engaged with the teeth 400 of the ratchet wheel 398, so that the wheel 398 is rotated in the forward direction and the sprocket 402 is rotated in the forward direction. Thus, the base tape 354 is fed forward. The pivotal movement of the pivotable plate 386 in the forward direction is limited by engagement of the ratchet pawl 408 with a stopper projection 406 fixed to the main frame 362. Thus, the leading one of the electronic components 350 from which the cover film has been peeled is fed to the component receiving position.

When the piston rod 382 is extended, the pivotable plate 386 is pivoted in the backward direction and the ratchet pawl 408 is moved over some of the teeth 400 of the ratchet wheel 398. The rotation of the ratchet wheel 398 in the backward direction is inhibited by a stopper lever 392 that is pivotable about a pin 394 and is biased by a spring 396. Thus, the base tape 354 is prevented from being moved backward opposite to the feeding direction, and accordingly the leading electronic component 350 is prevented from being moved from the component receiving position. That is, the stopper lever 392 positions the leading component 350 at the component receiving position. When the pivotable plate 386 is pivoted in the forward direction, the plate 386 is pivoted by an angle equal to a central angle of the number of teeth 400 over which the ratchet pawl 408 has been moved in the backward direction. The feeding pitch at which the component carrier tape 352 is fed forward is defined by the number of teeth 400 over which the pawl 408 is moved in the backward direction. Therefore, the feeding pitch can be changed by changing the limit of pivotal movement of the plate 386 in the backward direction. The limit of pivotal movement of the plate 386 in the backward direction is defined by a backward-direction stopper device 410 supported by the main frame 362.

The cover 378 has a U-shaped cross section, and a rear portion of the cover 378 is attached via a pin 418 to the main frame 362. The cover 378 includes a pair of side plates 420 (only one side plate is shown in FIG. 9) that has, in respective front end portions thereof, respective recesses 422 that are engaged with respective engaging members 424 attached to the main frame 362.

As shown in FIG. 10, in the state in which the component carrier tape 352 is supported on the main frame 362, respective side surfaces of respective side portions of the tape 352 that extend in the lengthwise direction fit, with substantially no space, in respective inner surfaces 434 of the two side plates 420 of the cover 378. Thus, the tape 352 is positioned in the widthwise direction. However, it is possible to position the tape 352 in the widthwise direction by causing close contact between either one of the two side surfaces of the tape 352 and a corresponding one of the side plates 420 of the cover 378, because of the following reasons: In the state in which the teeth 404 of the sprocket 402 are engaged with the perforations 359 of the component carrier tape 352, a portion of the tape 352 that is engaged with the teeth 404 is positioned in a horizontal plane, and a rotation of the tape 352 about that portion thereof in the horizontal plane is prevented by the cover 378. Thus, the tape 352 can be positioned in both the lengthwise and widthwise directions.

The cover 378 includes a top plate 432 that has an elongate hole 442 in a portion thereof that corresponds to the perforations 359 of the component carrier tape 352. Thus, the cover 378 is prevented from interfering with the teeth 404 of the sprocket 402. In addition, the cover 378 has, in a front end portion thereof corresponding to the component receiving position, an opening 444 (FIG. 9) that is formed through a thickness thereof and has a rectangular cross section through which each electronic component 350 can pass.

Figure 13:
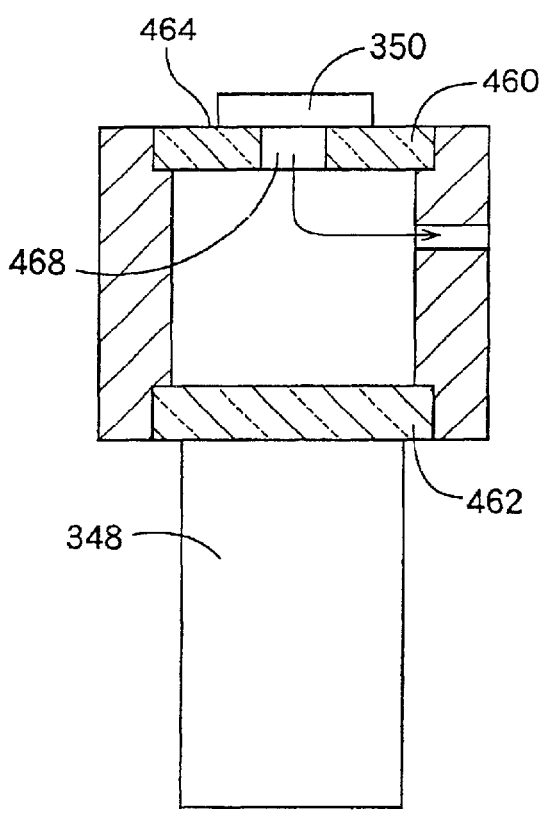
FIG. 13 is a partly cross-sectioned, front elevation view of a position detecting device of the electronic component feeder.

As shown in FIG. 13, the main frame 362 has, in a portion thereof corresponding to the component transferring position, a pair of transparent support members 460, 462 each formed of a transparent material, such that the two members 460, 462 are distant from each other in a vertical direction. The electronic component 350 conveyed from the component receiving positions is placed on an upper support surface 464 of the upper one of the two support members 460, 462. In the present embodiment, each of the transparent support members 460, 462 is formed of a transparent acrylic plate. Also, in the present embodiment, the upper surface 464 of the upper support plate 460 and respective bottom surfaces of the component accommodating pockets 358 of the component carrier tape 352 are located in the substantially same plane. The image taking device 348 is provided below the lower transparent support plate 462. In the present embodiment, the image taking device 348 is provided by a CCD camera, and takes an image of the electronic component 350 supported on the upper surface 464 of the upper transparent support plate 460, from a position below the component 350. In addition, an illuminating device, not shown, is provided for the image taking device 348 and, when the image taking device 348 takes an image, the illuminating device illuminates an object and its vicinity. The image taking device 348 may be provided by a camera including a linear sensor.

The upper transparent support plate 460 has a suction passage 468 that opens in the upper surface 464, and the suction passage 468 is connected to a suction device (not shown) via a space provided between the two transparent support plates 460, 462, a suction passage, not shown, formed in the main frame 362, and a control-valve device (FIG. 15) provided in an intermediate portion of the latter suction passage. After, or immediately before, the electronic component 350 is placed on the upper surface 464, the control-valve device 466 is so switched as to communicate the suction passage 468 with the suction device, so that the component 350 is sucked and held on the upper surface 464. Thus, when an image of the component 350 is taken by the image taking device 348, the component 350 is effectively prevented from being moved.

Figure 11:
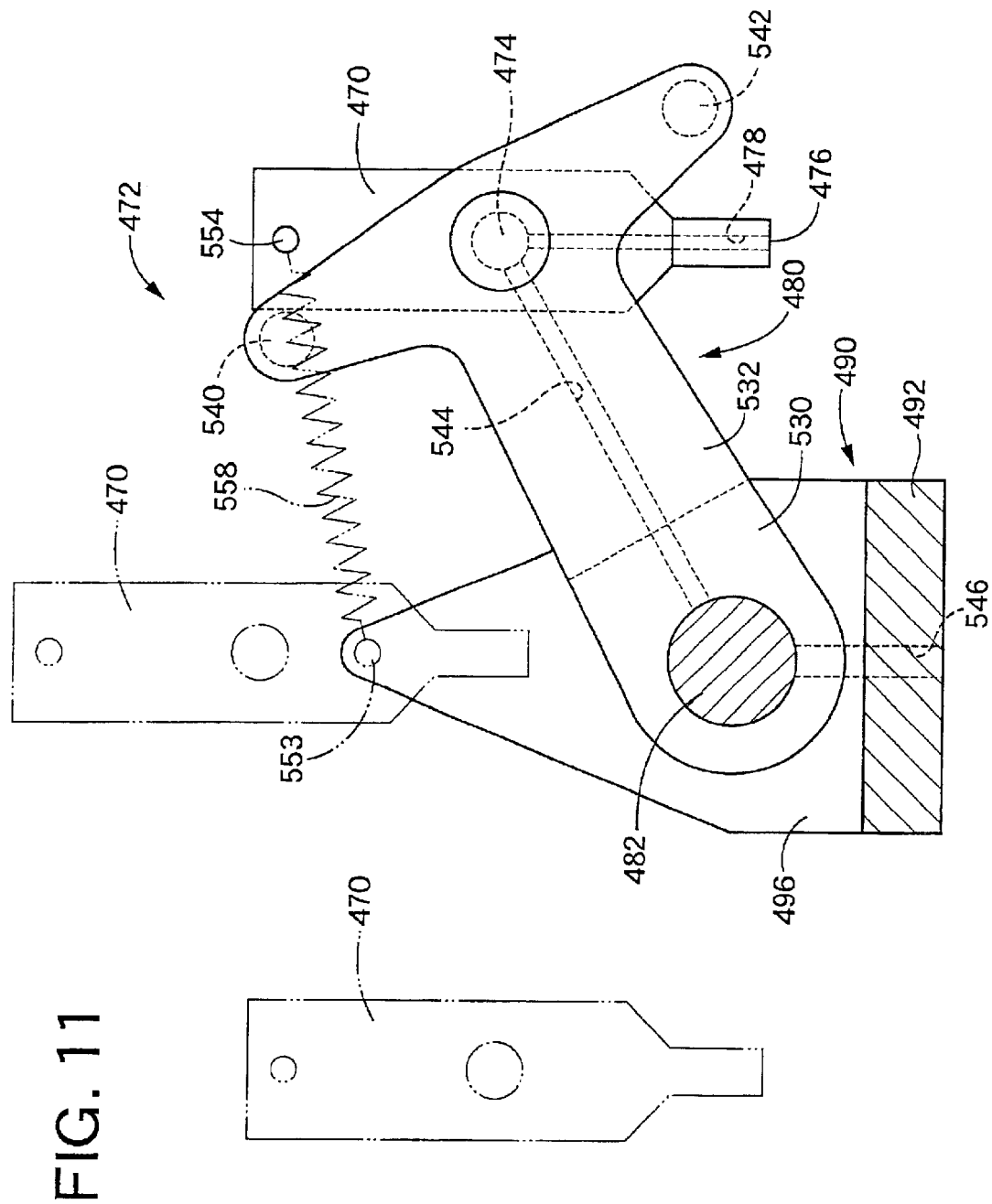
FIG. 11 is a partly cross-sectioned, front elevation view of a second conveying device of the electronic component feeder.

Next, there will be described the second conveying device that conveys the electronic component 350 conveyed by the tape feeding device 368, onto the upper transparent support member 460. As shown in FIGS. 9 and 11, the second conveying device includes a suction nozzle 470 as a sucker that applies a negative pressure to the electronic component 350 and thereby holds the component 350; and a moving device 472 that moves the suction nozzle 470 from the component receiving position to the component transferring position. The suction nozzle 470 is supported, via integral, embossed portions 474 thereof, by a pivotable member 480, such that the nozzle 470 is pivotable about a second axis line parallel to the widthwise (lateral) direction perpendicular to the component-convey direction. The suction nozzle 470 has a suction passage 478 opening in a lower surface 476 thereof. The pivotable member 480 is supported, via integral, embossed portions 482 thereof, by a support member 490, such that the pivotable member 480 is pivotable about a first axis line parallel to the widthwise direction perpendicular to the component-convey direction. The pivotable member 480 is pivoted by a pivoting device 486. In the present embodiment, the first and second axis lines are parallel to each other. In addition, the moving device 472 utilizes the pivotal movement of the suction nozzle 470 about the first axis line, for moving the electronic component 350 from the component receiving position to the component transferring position.

Figure 12:
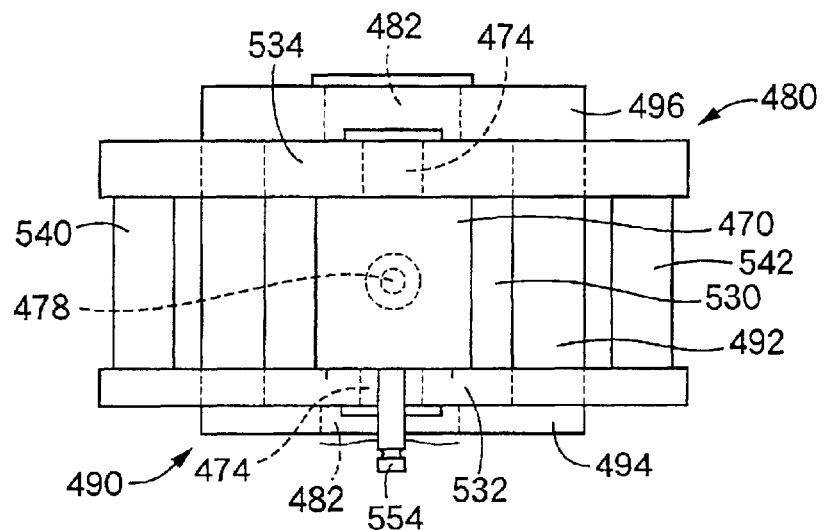
FIG. 12 is a plan view of the second conveying device.

The support member 490 supports the pivotable member 480 such that the pivotable member 480 is pivotable about the first axis line. As shown in FIG. 9, the support member 490 is provided, on the main frame 362, between the component receiving position and the component transferring position. As shown in FIGS. 11 and 12, the support member 490 includes a bottom portion 492, and a pair of side walls 494, 496 extending upward from the bottom portion 492. Thus, the support member 490 has a U-shaped cross section that opens upward. The two embossed portions 482 of the pivotable member 480 are supported by the two side walls 494, 496 of the support member 490, respectively, such that the pivotable member 480 is pivotable about the axis lines of the embossed portions 482 in a space defined by, and between, the two side walls 494, 496. The width of each of the two side walls 494, 496 gradually decreases in a direction away from the bottom portion 492, and the each side wall 494, 496 has a generally triangular shape. The moving device 470 includes the pivotable member 480, the pivoting device 486, and the support member 490.

The pivoting device 486 includes an air-cylinder device 500 as a drive source, and a lever 508 connected to an end portion of a piston rod 502 of the air-cylinder device 500. One end portion of the lever 508 is pivotally connected to a connecting member 504 fixed to the end portion of the piston rod 502, and the other end portion of the lever 508 is pivotally connected to a connecting member 510 fixed to one of the embossed portions 482 of the pivotable member 480. The connecting member 504 is engaged, via a guide block 516, with a guide rail 514 fixed to the main frame 362. Thus, when the piston rod 502 is extended or retracted and accordingly the connecting member 504 is moved forward or backward in a direction parallel to the component-convey direction, the movement of the connecting member 504 is guided by the guide rail 514. When the connecting member 504 is moved forward or backward, the above-indicated one end portion of the lever 508 is also moved forward or backward, and accordingly the connecting member 510 is pivoted about the axis line of the embossed portion 482. Thus, the embossed portion 482 is pivoted and accordingly the pivotable member 480 is pivoted.

As shown in FIGS. 11 and 12, the pivotable member 480 includes a base portion 530 including the embossed portions 482, and a pair of side portions 532, 534 extending from the base portion 530, and accordingly the pivotable member 480 has a U-shaped cross section. A free end portion of each of the side portions 532, 534 that is remote from the base portion 530 has an increased width. Thus, each side portion 532, 534 has a generally T-shaped configuration. Respective central portions of the respective free end portions of the two side portions 532, 534 cooperate with each other to support the embossed portions 474 of the suction nozzle 470, such that the suction nozzle 470 is pivotable about the axis line of the embossed portions 474 in the space defined by, and between, the two side portions 532, 534. Two stopper members 540, 542 are provided between the two side portions 532, 534, such that each of the stopper members 540, 542 connects between respective opposed end portions of the widened free end portions of the two side portions 532, 534. The stopper members 540, 542 cooperate with each other to provide a stopper device.

Figure 14:
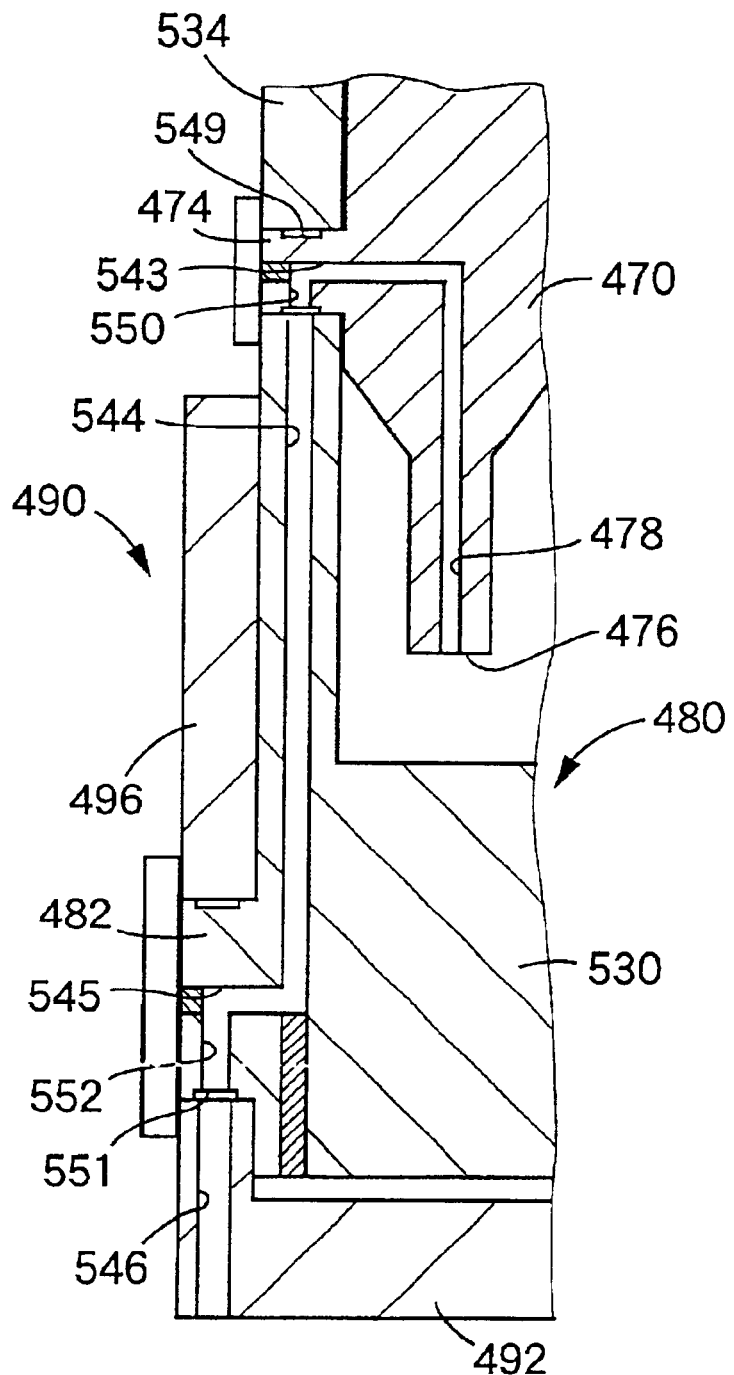
FIG. 14 is a cross-sectioned side elevation view of the second conveying device.
Figure 15:
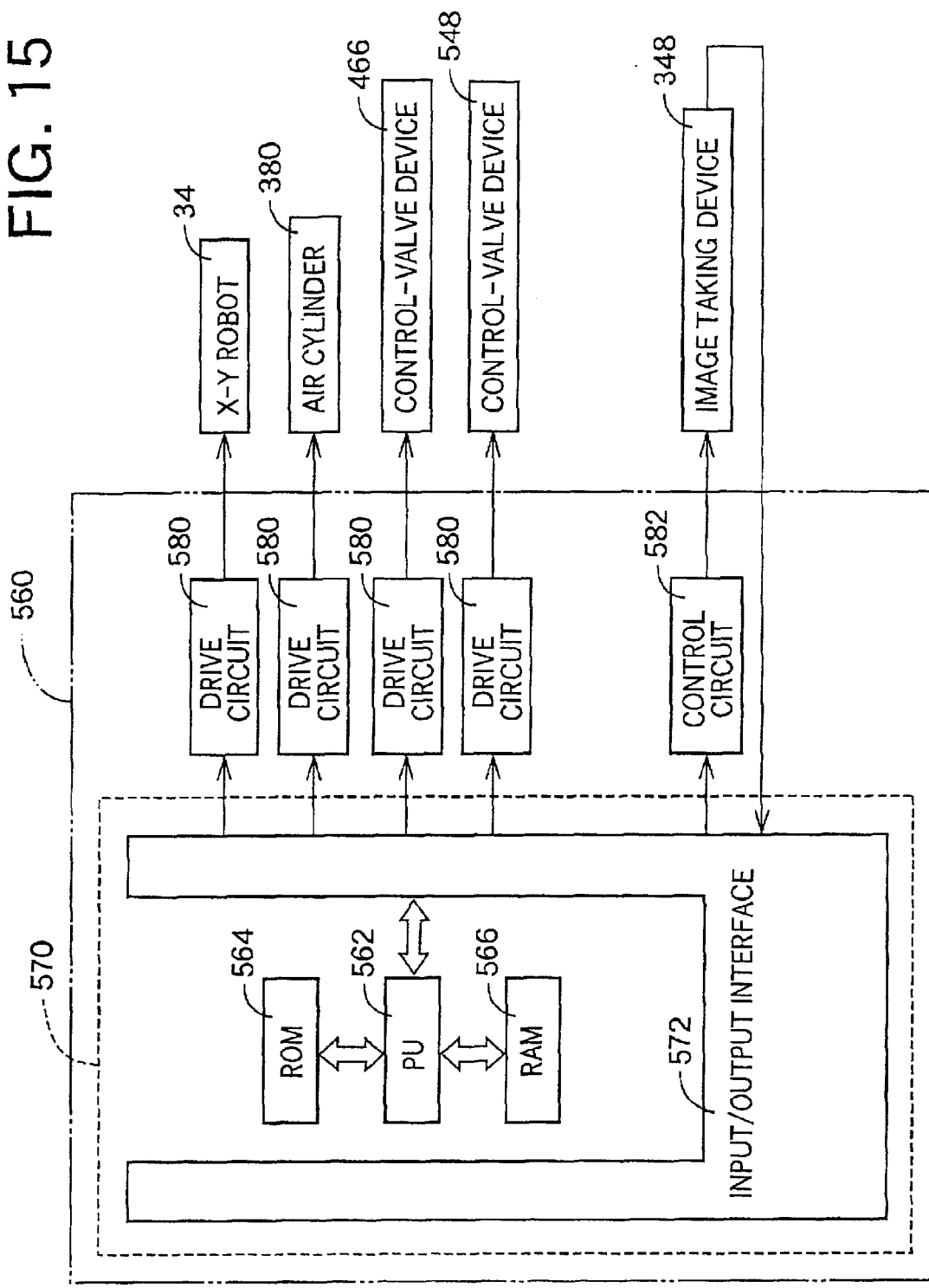
FIG. 15 is a diagrammatic view of a portion of a control device of the electronic component feeder that relates to the present invention.

The side portion 534 of the pivotable member 480 has a greater thickness than that of the side portion 532, and the side wall 496 of the support member 490 has a greater thickness than that of the side wall 494. The suction passage 478 formed in the suction nozzle 470 is communicated with a suction passage (not shown) formed in the main frame 362 via respective suction passages 543, 544, 545, 546 (FIG. 14) formed in the embossed portion 474, the side portion 534, the embossed portion 482, and the side wall 496, and the suction passage of the main frame 362 is communicated with a suction device (not shown) via a control-valve device 548 (FIG. 15). As shown in FIG. 14, an annular passage 549 communicated with the suction passage 544 is formed in an outer circumferential surface of the embossed portion 474, such that the annular passage 549 is communicated with the suction passage 543 via a passage 550. Therefore, even if the suction nozzle 470 is pivoted, the communication between the suction passage 543 and the suction passage 544 is always maintained. Likewise, the embossed portion 482 has an annular passage 551 communicated with the suction passage 546, and a passage 552 for communication between the annular passage 551 and the suction passage 545, so that even if the pivotable member 480 is pivoted, the communication between the suction passage 544 and the suction passage 546 is always maintained.

The side wall 494 of the support member 490 includes a retaining portion 553, indicated at two-dot chain line in FIG.

11, that projects in a direction parallel to the first and second axis lines and away from the side wall 496. Meanwhile, an upper end portion of the suction nozzle 470, located above the axis line (the first axis line) of the embossed portions 482 as shown in FIGS. 11 and 12, includes a retaining portion 554 that projects in a direction parallel to the first and second axis lines. The two retaining portions 553, 554 cooperate with each other to retain a tension coil spring 558 as a biasing device. The retaining portion 554 provides a first retaining portion, and the retaining portion 553 provides a second retaining portion. In a state in which the pivotable member 480 has been pivoted from a middle position of a pivotal-movement range thereof toward the component receiving position, the tension coil spring 558 biases the suction nozzle 470 such that a lower end portion of the nozzle 470 is pivoted in a direction away from the support member 490 (in a counterclockwise direction in FIG. 11); and in a state in which the pivotable member 480 has been pivoted from the middle position of the pivotal-movement range thereof toward the component transferring position, the tension coil spring 558 biases the suction nozzle 470 such that the lower end portion of the nozzle 470 is pivoted in a direction away from the support member 490 (in a clockwise direction in FIG. 11). When the suction nozzle 470 is biased such that the lower end portion of the nozzle 470 is pivoted in the counterclockwise direction (indicated at solid line in FIG. 11), the limit of pivotal movement of the nozzle 470 is defined by engagement of the nozzle 470 with the stopper member 540; and when the nozzle 470 is biased such that the lower end portion of the nozzle 470 is pivoted in the clockwise direction, the limit of pivotal movement of the nozzle 470 is defined by engagement of the nozzle 470 with the stopper member 542. Thus, in the state in which the suction nozzle 470 is positioned at the component receiving or transferring position, the tension coil spring 558 biases the nozzle 470 such that the nozzle 470 is engaged with the stopper member 540 or 542, so that a central axis line of the nozzle 470 is kept substantially vertical. In addition, in a state in which the nozzle 470 is positioned at the middle position of the pivotal-movement range thereof, the tension coil spring 558 applies substantially no biasing force to the nozzle 470. Therefore, when the pivotable member 480 is pivoted from the middle position of the pivotal-movement range toward the component receiving or transferring position, the nozzle 470 is effectively prevented from being subjected to a great impact and accordingly the electronic component 350 sucked and held by the nozzle 470 is prevented from falling off the nozzle 470 because of the great impact. The relative position of the retaining portions 553, 554 are so designed that the tension coil spring 558 functions in the above-described manner.

The present electronic-component mounting system is operated under control of a control device 560 shown in FIG. 15. The control device 560 is essentially provided by a computer 570 including a PU 562, a ROM 564, a RAM 566, and a bus for connecting those elements to one another. The bus is also connected to an input/output interface 572. The input/output interface 572 is connected via respective drive circuits 580 to the X-Y robot 34, the air-cylinder device 380 (the control-valve device thereof), the control-valve device 466 of the suction device connected to the suction passage 468 of the transparent support member 460, and the control-valve device 548 of the air-cylinder device 500. In addition, the input/output interface 572 is connected via a control circuits 582 to the image taking device 348.

Next, there will be described the operation of the electronic-component feeder 332 constructed as described above. Before electronic components 350 are supplied, the limit of the pivotal movement of the pivotable plate 386 in the backward direction may be changed, as needed, depending upon the feeding pitch at which the component carrier tape 352 is to be fed. In the state in which the piston rod 382 of the air-cylinder device 380 has been extended and the backward movement of the pivotable plate 386 has been stopped by the engagement of the stopper block 384 with the backward-movement stopper device 410, the ratchet pawl 392 has already been moved over a prescribed number of teeth 400 of the ratchet wheel 398. In this state, if the piston rod 382 is retracted, the pivotable plate 386 is pivoted and accordingly the ratchet wheel 398 and the sprocket 402 are rotated with the plate 386. Thus, one-pitch length of the component carrier tape 352 is fed and the leading one of the electronic components 350 from which the cover film has been peeled is fed to the component receiving position.

Then, the piston rod 382 is extended. Consequently the pivotable plate 386 is pivoted in the backward direction, but the ratchet wheel 398 is not rotated. Thus, the carrier tape 352 is not fed in the backward direction. In synchronism with the extension of the piston rod 382, the suction nozzle 470 is pivoted from the component transferring position to the component receiving position. Immediately before, or at the same time as, the time when the nozzle 470 contacts the upper surface of the electronic component 350, the suction passage 478 of the nozzle 470 is communicated with the suction device, so that the component 350 is sucked and held by the lower surface 476 of the nozzle 470. In the state in which the suction nozzle 470 sucks and holds the electronic component 350, the pivoting device 486 moves the nozzle 470 to the component transferring position where the component 350 is placed on the upper surface 464 of the transparent support plate 460. Since the component 350 placed on the transparent support plate 460 is attracted, by the suction device, toward the upper surface 464 of the plate 460, the component 350 is stably held on the upper surface 464 and accordingly is prevented from being moved out of position when an image of the component 350 is taken.

After the electronic component 350 has been placed on the transparent support plate 460 and suction has been applied to the component 350, the image taking device 348 takes an image of the component 350 from a position below the component 350. Image data representing the thus taken image are compared with image data representing an image of an electronic component 350 placed at a correct position, so as to calculate positional errors of the component 350 placed at the component transferring position. The positional errors of the component 350 include positional errors $\Delta X$, $\Delta Y$ of the component 350 from reference positions on an X-Y coordinate plane, and an angular error $\Delta \theta$ of the component 350 about a vertical line passing through the reference positions. Those image data are processed by an image processing portion of the computer 570, and data representing the calculated positional errors are supplied to the computer 570. Before an appropriate component holding head 30 is moved to the component taking position to take the electronic component 350, the image of the component 350 is taken, the taken image is processed, and the calculated positional errors are supplied from the computer 570, so that the component holding head 30 is stopped at positions obtained by modifying reference positions by the positional errors. This modification is carried out by movement of the X-Y robot 34. Then, the head 30 is lowered to take the component 350. When the head 30 takes the component at the component taking position, the suction nozzle 470 has been moved from the component transferring position to the component receiving position, and accordingly the nozzle 470 does not interfere with the head 30.

The component holding head 30 that has been positioned at the component taking position is lowered so that the suction surface of the suction nozzle 470 contacts the surface of the electronic component 350. Immediately before the contact, the nozzle 470 is communicated with the vacuum source, and suction is applied to the air present in the nozzle 470. Therefore, once the nozzle 470 contacts the component 350, the nozzle sucks and holds the component. Since, at that time, the component 350 is held, by the negative pressure, on the upper surface 464 of the transparent support plate 460, the component 350 is prevented from changing its posture, and accordingly is sucked and held in its correct posture by the nozzle 470 with reliability. After the component 350 is sucked and held by the nozzle 470, suction is released from the upper surface 464 of the transparent support member 460. Thus, when the component holding head 30 is just moved upward, the electronic component 350 can be easily taken from the electronic-component feeder 332.

Since in the present embodiment each component holding head 30 can reliably suck and hold the center of an electronic component 350, failures to hold components can be reduced. The head 30 holding the component 350 is moved to a prescribed component-mount place on a printed wiring board 20, and then is lowered to mount the component at the component-mount place on the board 20. During a time duration in which the head 30 conveys the component 350 to the board 20, a posture of the component 350 held by the head 30 may be detected and modified. In the present embodiment, however, that detection or modification can be omitted. This contributes to reducing the time needed to mount the components and thereby improving the operation efficiency.

In addition, the taken image of the electronic component 350 may be processed to inspect a defect of the component. If the component 350 is judged as a defective component, then the component holding head 30 is operated to suck and hold the component 350, and is moved to a defective-component discarding position where the head 30 discards the component 350. Therefore, it is not needed to inspect a defect of the component 350 that has been held by the head 30. This also contributes to improving the efficiency of mounting of components.

Figure 16:
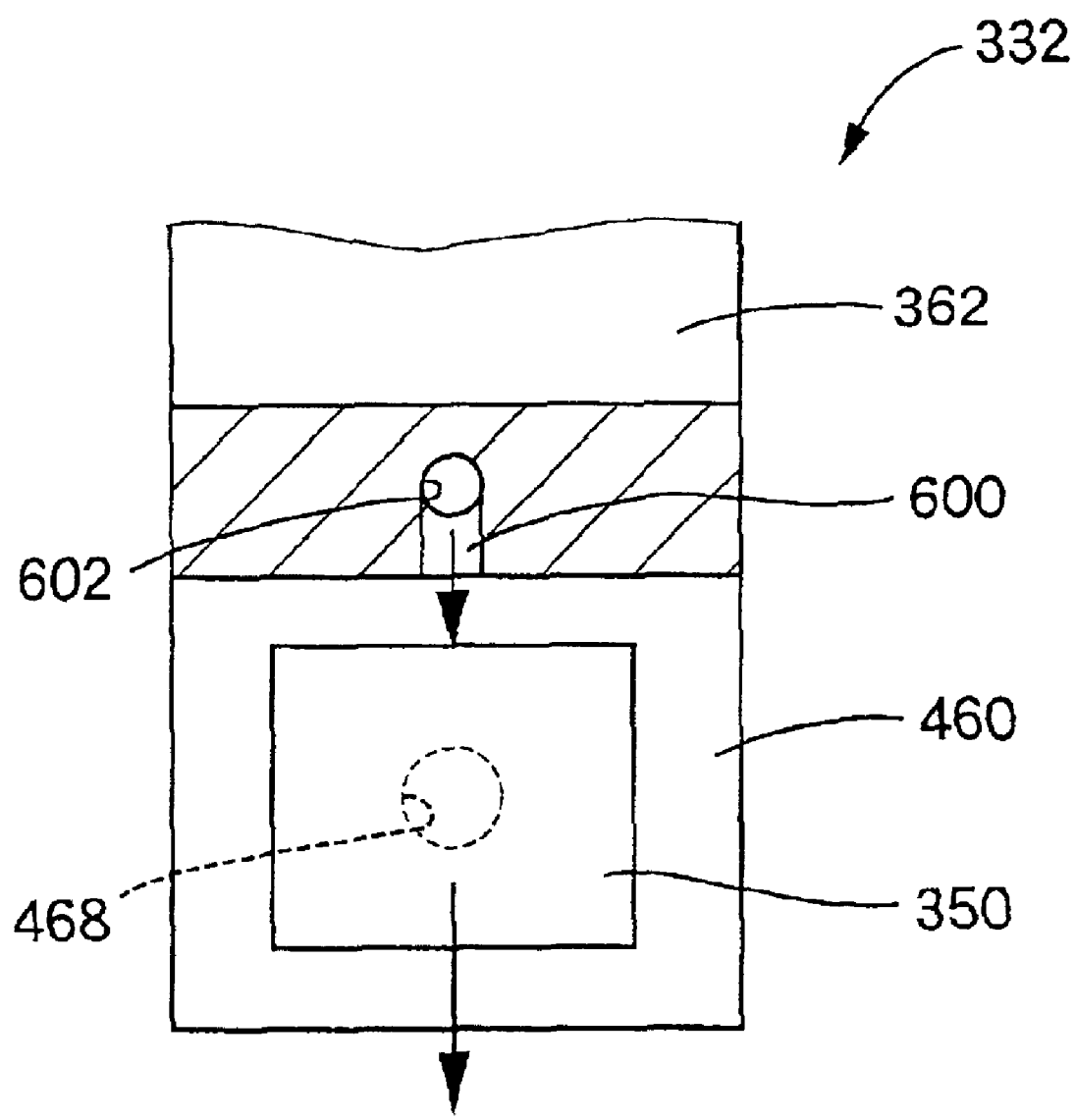
FIG. 16 is a partly cross-sectioned, plan view of a position detecting device of another electronic component feeder as another embodiment of the present invention.

Each electronic-component feeder 332 may be provided with a defective-component discarding device. For example, as shown in FIG. 16, the defective-component discarding device includes an air blowing hole 600 that is provided, on an upstream side of the transparent support member 460 in the component-convey direction, at a position where the hole 600 does not interfere with other elements. The hole 600 opens toward the component transferring position, and is connected to a pressurized-air producing device via an air passage 602 formed in the main frame 362 of the feeder. If an image of the electronic component 350 is processed and it is judged that the component 350 is defective, the pressurized air is blown from the blowing hole 600 to blow off the component 350 in the forward direction. The component 350 blown off is collected in a collecting box, not shown, that is provided in a front portion (a component-convey-direction downstream-side portion) of the feeder 332.

In the illustrated embodiment, the tension coil spring 558 may be omitted, and the stopper members 540, 542 may also be omitted. In the latter case, the suction nozzle 470 is supported via the embossed portions 474 by the pivotable member 480, such that the nozzle 470 hangs from the pivotable member 480.

In the case where a plurality of component holding heads can be positioned independent of each other, as recited in Japanese Patent Application No. 2001-208851 that was filed by the assignee of the present application and has not been published yet, those component holding heads can be operated to simultaneously suck and hold respective electronic components from a plurality of electronic-component feeders 332, respectively.

While the present invention has been described in detail in its embodiments, it is to be understood that the present invention may be embodied with various changes and improvements, such as those described in SUMMARY OF THE INVENTION, which may occur to a person skilled in the art.

What is claimed is:

1. An electric component feeder, comprising:
    a component conveying device which conveys, in a component-convey direction, a plurality of electric components, one by one, to a component-supply portion of the feeder; and
    at least one of (a) a positioning device which is provided in the component-supply portion of the feeder and which positions each of the electric components in each of the component-convey direction and a lateral direction perpendicular to the component-convey direction, and which includes two positioning surfaces facing the component-convey direction and the lateral direction, respectively, and a close-contact causing device which causes a close contact between said each electric component and each of the two psitioning surfaces, and (b) a position detecting device which is provided in the component-supply portion of the feeder and which detects a position of each of the electric components in the component-supply portion.

2. A feeder according to claim 1 wherein the close-contact causing device comprises:
    a pressing member which presses an opposite side surface of said each electric component that is opposite to an other side surface thereof facing one of the two positioning surfaces; and
    a pressing-member driving device which drives the pressing member so as to press the opposite side surface of said each electric component and thereby cause the close contact between the other side surface of said each electric component and said one positioning surface.

3. A feeder according to claim 1, wherein the component conveying device comprises:
    an endless, conveying belt which has a component-support surface supporting the electric components; and
    a belt circulating device which circulates the conveying belt,
    and wherein the close-contact causing device comprises the component conveying device that causes the close contact between said each electric component and one of the positioning surfaces that faces the component-convey direction.

4. A feeder according to claim 1, wherein the close-contact causing device comprises a non-contact driving device which drives, without contact, said each electric component toward at least one of the positioning surfaces.

5. A feeder according to claim 4, wherein the non-contact driving device comprises a pneumatic driving device which pneumatically drives said each electric component toward said one positioning surface.

6. A feeder according to claim 5, wherein the pneumatic driving device comprises:
   a suction passage which opens in said one positioning surface; and
   a suction device which sucks air through the suction passage.

7. A feeder according to claim 1, wherein the close-contact causing device comprises a magnet which attracts said each electric component toward at least one of the positioning surfaces.

8. A feeder according to claim 7, wherein the magnet comprises:
   an electromagnet; and
   an electric-current control device which controls an electric current supplied to the electromagnet.

9. A feeder according to claim 1, wherein the position detecting device comprises an image taking device which takes an image of said each electric component.

10. A feeder according to claim 9, wherein the position detecting device further comprises a transparent support member which is formed of a transparent material and which supports a bottom of said each electric component, and wherein the image taking device takes, at a position below the transparent support member, an image of said each electric component supported by the transparent support member.

11. A feeder according to claim 10, wherein the transparent support member has a support surface which supports said each electric component, and a suction passage which opens in the support surface so as to apply a negative pressure to said each electric component and thereby attract said each electric component to the support surface.

12. A feeder according to claim 10, wherein the component conveying device comprises:
   a first conveying device which conveys the electric components in an array; and
   a second conveying device which takes said each electric component conveyed by the first conveying device and conveys said each electric component onto the transparent support surface.

13. A feeder according to claim 12, wherein the second conveying device comprises:
   a suction member which has a lower surface and a suction passage opening in the lower surface and which applies a negative pressure to said each electric component and thereby attracts said each electric component to the lower surface; and
   a moving device which moves the suction member to a receiving position located in a downstream-end portion of the first conveying device and to a transferring position facing the transparent support member.

14. A feeder according to claim 13, wherein the moving device comprises:
   a pivotable member which is pivotable about a substantially horizontal first axis line and which supports the suction member such that the suction member is pivotable about a second axis line parallel to the first axis line; and
   a pivoting device which pivots the pivotable member about the first axis line.

15. A feeder according to claim 14, wherein the moving device further comprises:
   a stopper device which engages, at at least opposite ends of a pivotal-movement range in which the pivotable member is pivotable, the suction member to stop respective pivotal movements of the suction member at the opposite ends of the pivotal-movement range; and
   a biasing device which biases, at at least the opposite ends of the pivotal-movement range, the suction member in respective directions in each of which the suction member engages the stopper device.

16. A feeder according to claim 15, wherein the biasing device biases, in a state in which the pivotable member has been pivoted in a clockwise direction from a middle point of the pivotal-movement range, the suction member relative to the pivotable member in a direction in which the suction member is pivoted in a counterclockwise direction and biases, in a state in which the pivotable member has been pivoted in the counterclockwise direction from the middle point of the pivotal-movement range, the suction member relative to the pivotable member in a direction in which the suction member is pivoted in the clockwise direction.

17. A feeder according to claim 16, wherein the moving device further comprises a pivotable-member support member which supports the pivotable member such that the pivotable member is pivotable about the first axis line, wherein the suction member includes a first retaining portion positioned above the first axis line and the pivotable-member support member includes a second retaining portion, wherein a tension coil spring is retained by, and between, the first and second retaining portions, and wherein the first and second retaining portions are positioned relative to each other such that at at least the opposite ends of the pivotal-movement range of the pivotal member, the suction member is biased, based on a tensile force of the tension coil spring, in respective directions in each of which the suction member engages the stopper device.

18. A feeder according to claim 14, wherein the moving device further comprises a pivotable-member support member which supports the pivotable member such that the pivotable member is pivotable about the first axis line.

* * * * *